US012675043B2

(12) United States Patent 
Bocanegra Evans et al.

(10) Patent No.: US 12,675,043 B2 
(45) Date of Patent: Jul. 7, 2026

(54) SYSTEMS AND METHODS FOR GENERATING DROP PATTERNS

(71) Applicant: CANON KABUSHIKI KAISHA, Tokyo (JP)

(72) Inventors: Humberto Bocanegra Evans, Austin, TX (US); Niyaz Khusnatdinov, Round Rock, TX (US); James W. Irving, Austin, TX (US); Craig William Cone, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 34 days.

(21) Appl. No.: 18/818,035

(22) Filed: Aug. 28, 2024

(65) Prior Publication Data

US 2026/0063986 A1 Mar. 5, 2026

(51) Int. Cl. 
*G03F 7/00* (2006.01)

(52) U.S. Cl. 
CPC .................................. *G03F 7/0002* (2013.01)

(58) Field of Classification Search 
CPC .................................................... G03F 7/0002 
See application file for complete search history.

(56) References Cited

U.S. PATENT DOCUMENTS

| | | | |
|---|---|---|---|
| 6,936,194 B2 | 8/2005 | Watts | |
| 8,066,930 B2 | 11/2011 | Sreenivasan | |
| 8,349,241 B2 | 1/2013 | Sreenivasan | |
| 8,512,797 B2 | 8/2013 | Schumaker | |
| 8,586,126 B2 | 11/2013 | Schumaker | |
| 11,215,921 B2 | 1/2022 | Thompson | |
| 11,556,055 B2 | 1/2023 | Hussein | |
| 2009/0014917 A1* | 1/2009 | Hodge | B82Y 10/00 |
| | | | 264/401 |
| 2009/0148619 A1* | 6/2009 | LaBrake | G03F 7/0002 |
| | | | 427/256 |
| 2013/0251906 A1 | 9/2013 | Takimoto | |
| 2020/0401040 A1* | 12/2020 | Khusnatdinov | G03F 7/0002 |
| 2021/0397082 A1 | 12/2021 | Hussein | |
| 2024/0006209 A1 | 1/2024 | Patel | |

OTHER PUBLICATIONS

Aryan Mehboudi et al., Modeling the Squeeze Flow of Droplet Over a Step, Physics of Fluids, Aug. 2, 2022, pp. 1-15, vol. 34, Issue 8, Article 082005, AIP Publishing, Melville, NY.

\* cited by examiner

*Primary Examiner* — James M Mellott 
(74) *Attorney, Agent, or Firm* — Canon U.S.A., Inc. IP Division

(57) ABSTRACT

A method of method of assigning a drop position in a drop pattern includes receiving a predetermined fluid drop volume of a drop, receiving information regarding an array of cells defining a desired fill set associated with the predetermined fluid drop volume, wherein the information includes a predetermined fluid volume of each cell of the array of cells and a predetermined location of each cell of the array of cells, determining a distance from a center of mass of the array of cells to the predetermined location of each cell of a plurality of cells of the array of cells, identifying, among cells of the plurality of cells whose distance from the center of mass is within a predetermined threshold distance, a cell having the largest predetermined fluid volume, and assigning the predetermined location of the identified cell as the drop position of the drop in the drop pattern.

17 Claims, 16 Drawing Sheets

164

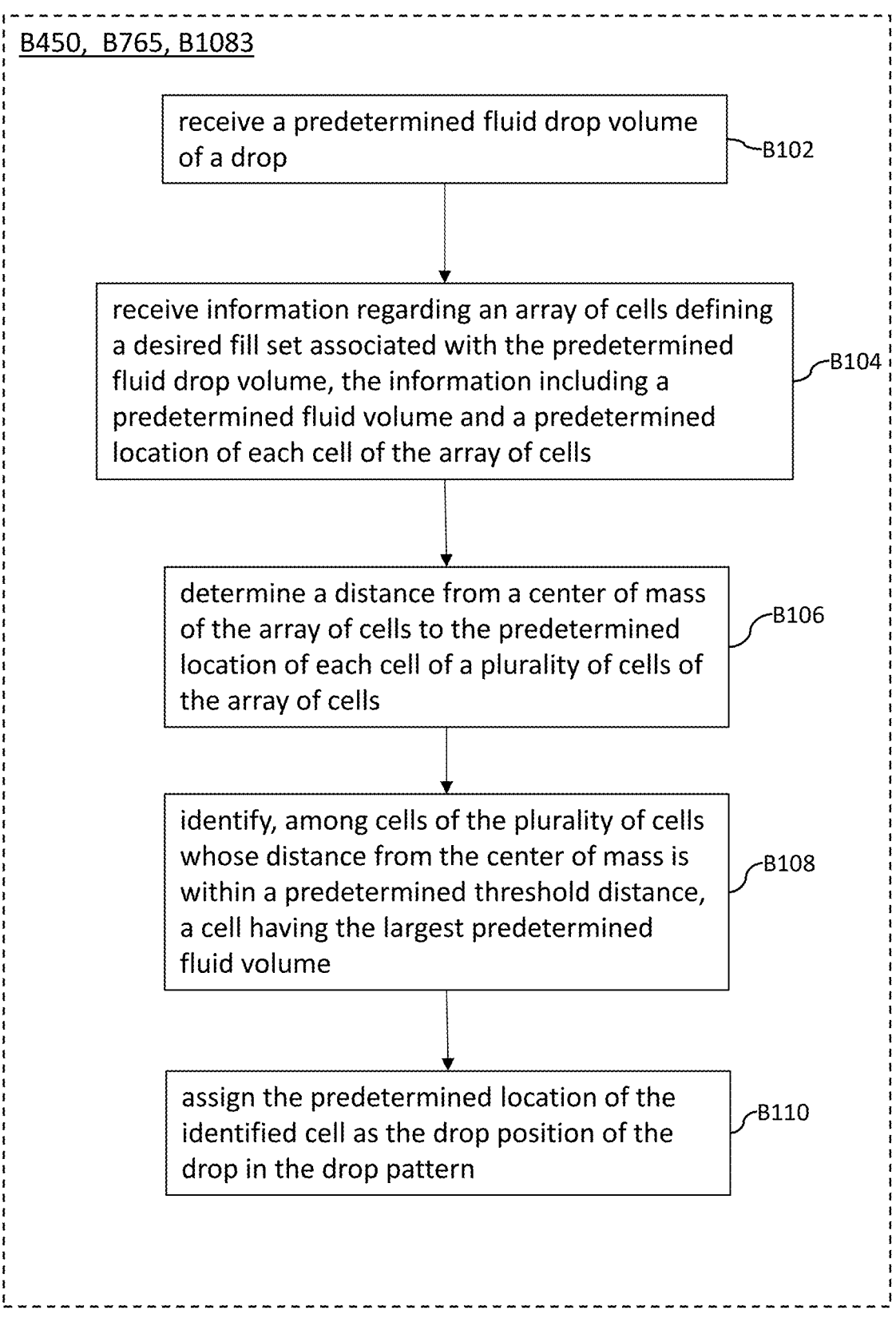

B450, B765, B1083 receive a predetermined fluid drop volume of a drop ~B102 receive information regarding an array of cells defining a desired fill set associated with the predetermined fluid drop volume, the information including a predetermined fluid volume and a predetermined location of each cell of the array of cells ~B104 determine a distance from a center of mass of the array of cells to the predetermined location of each cell of a plurality of cells of the array of cells ~B106 identify, among cells of the plurality of cells whose distance from the center of mass is within a predetermined threshold distance, a cell having the largest predetermined fluid volume ~B108 assign the predetermined location of the identified cell as the drop position of the drop in the drop pattern ~B110

FIG. 10

Minimum Volume Requirement ■    Maximum Volume Requirement ☐

SYSTEMS AND METHODS FOR GENERATING DROP PATTERNS

BACKGROUND

Technical Field

This application generally concerns generating drop patterns for imprint lithography.

Background

Nano-fabrication includes the fabrication of very small structures that have features that are 100 nanometers or smaller. One application of nano-fabrication is the fabrication of integrated circuits. The semiconductor-processing industry continues to strive for larger production yields while increasing the circuits per unit area formed on a substrate. Improvements in nano-fabrication include providing greater process control and improving throughput while also allowing continued reduction of the minimum feature dimensions of the structures formed.

One nano-fabrication technique is commonly referred to as nanoimprint lithography. Nanoimprint lithography is useful in a variety of applications including, for example, fabricating one or more layers of integrated devices. Examples of an integrated device include CMOS logic, microprocessors, NAND Flash memory, NOR Flash memory, DRAM memory, MRAM, 3D cross-point memory, Re-RAM, Fe-RAM, STT-RAM, MEMS, and the like. Examples of nanoimprint lithography systems and processes are described in detail in numerous publications, such as U.S. Pat. Nos. 8,349,241, 8,066,930, and 6,936,194.

The nanoimprint lithography technique disclosed in each of the aforementioned patents describes the formation of a relief pattern in a formable material (polymerizable) layer and transferring a pattern corresponding to the relief pattern into or onto an underlying substrate. The patterning process uses a template spaced apart from the substrate, and a formable liquid is applied between the template and the substrate. The formable liquid is solidified to form a solid layer that has a pattern conforming to a shape of the surface of the template that is in contact with the formable liquid. After solidification, the template is separated from the solidified layer such that the template and the substrate are spaced apart. The substrate and the solidified layer are then subjected to additional processes, such as etching processes, to transfer a relief image into the substrate that corresponds to the pattern in the solidified layer. The patterned substrate can be further subjected to known steps and processes for device (article) fabrication, including, for example, curing, oxidation, layer formation, deposition, doping, planarization, etching, formable material removal, dicing, bonding, packaging, and the like.

U.S. Pat. No. 11,556,055 (hereafter "the '055 patent") discloses a method for generating a drop pattern for imprint lithography, which is hereby incorporated by reference herein in its entirety. In the method of the '055 patent, as well as in other disclosed drop pattern generating methods, when drops are dispensed according to the drop patterns generated by the disclosed methods, in many cases the drops are dispensed relatively far away (e.g., 20 microns or greater) from relatively large etched features (e.g., features having a width of 50 microns or greater). When this situation happens, i.e., when drops are dispensed too far from relatively large features, it takes longer than desired for the relatively large features to fill. Longer fill times negatively effects production time (i.e., throughput). Thus, there is a need for a method of generating drop patterns, that, when dispensed, places the drops closer (e.g., less than 20 microns) to relatively large features (e.g., features having a width of 50 microns or greater).

SUMMARY

A method of method of assigning a drop position in a drop pattern includes receiving a predetermined fluid drop volume of a drop, receiving information regarding an array of cells defining a desired fill set associated with the predetermined fluid drop volume, wherein the information includes a predetermined fluid volume of each cell of the array of cells and a predetermined location of each cell of the array of cells, determining a distance from a center of mass of the array of cells to the predetermined location of each cell of a plurality of cells of the array of cells, identifying, among cells of the plurality of cells whose distance from the center of mass is within a predetermined threshold distance, a cell having the largest predetermined fluid volume, and assigning the predetermined location of the identified cell as the drop position of the drop in the drop pattern.

A system for imprinting or planarizing includes a substrate chuck configured to hold a substrate, a dispenser configured to supply formable material onto the substrate, and a controller configured to control the dispenser in accordance with a drop pattern of the formable material that indicates drop locations where respective drops of the formable material are to be supplied onto the substrate. The controller is further configured to: receive a predetermined fluid drop volume of a drop, receive information regarding an array of cells defining a desired fill set associated with the predetermined fluid drop volume, wherein the information includes a predetermined fluid volume of each cell of the array of cells and a predetermined location of each cell of the array of cells, determine a distance from a center of mass of the array of cells to the predetermined location of each cell of a plurality of cells of the array of cells, identify, among cells of the plurality of cells whose distance from the center of mass is within a predetermined threshold distance, a cell having the largest predetermined fluid volume, and assign the predetermined location of the identified cell as the drop position of the drop in the drop pattern.

A method of manufacturing an article includes a) receiving a predetermined fluid drop volume of the drop, b) receiving information regarding an array of cells defining a desired fill set associated with the predetermined fluid drop volume, wherein the information includes a predetermined fluid volume of each cell of the array of cells and a predetermined location of each cell of the array of cells, c) determining a distance from a center of mass of the array of cells to the predetermined location of each cell of a plurality of cells of the array of cells, d) identifying, among cells of the plurality of cells whose distance from the center of mass is within a predetermined threshold distance, a cell having the largest predetermined fluid volume, e) assigning the predetermined location of the identified cell as the drop position of the drop in the drop pattern, f) repeating a) to e) until completing the drop pattern, g) dispensing drops of formable material onto a according to the completed drop pattern, h) contacting the dispensed drops with a template or superstrate to form a film, i) exposing the film under the template to actinic radiation, j) processing the substrate, and k) forming the article from the processed substrate.

BRIEF DESCRIPTION OF THE DRAWINGS

FIG. 10 illustrates example embodiment of an operational flow for assigning a location of a drop in a drop pattern.

DESCRIPTION

Figure 1:
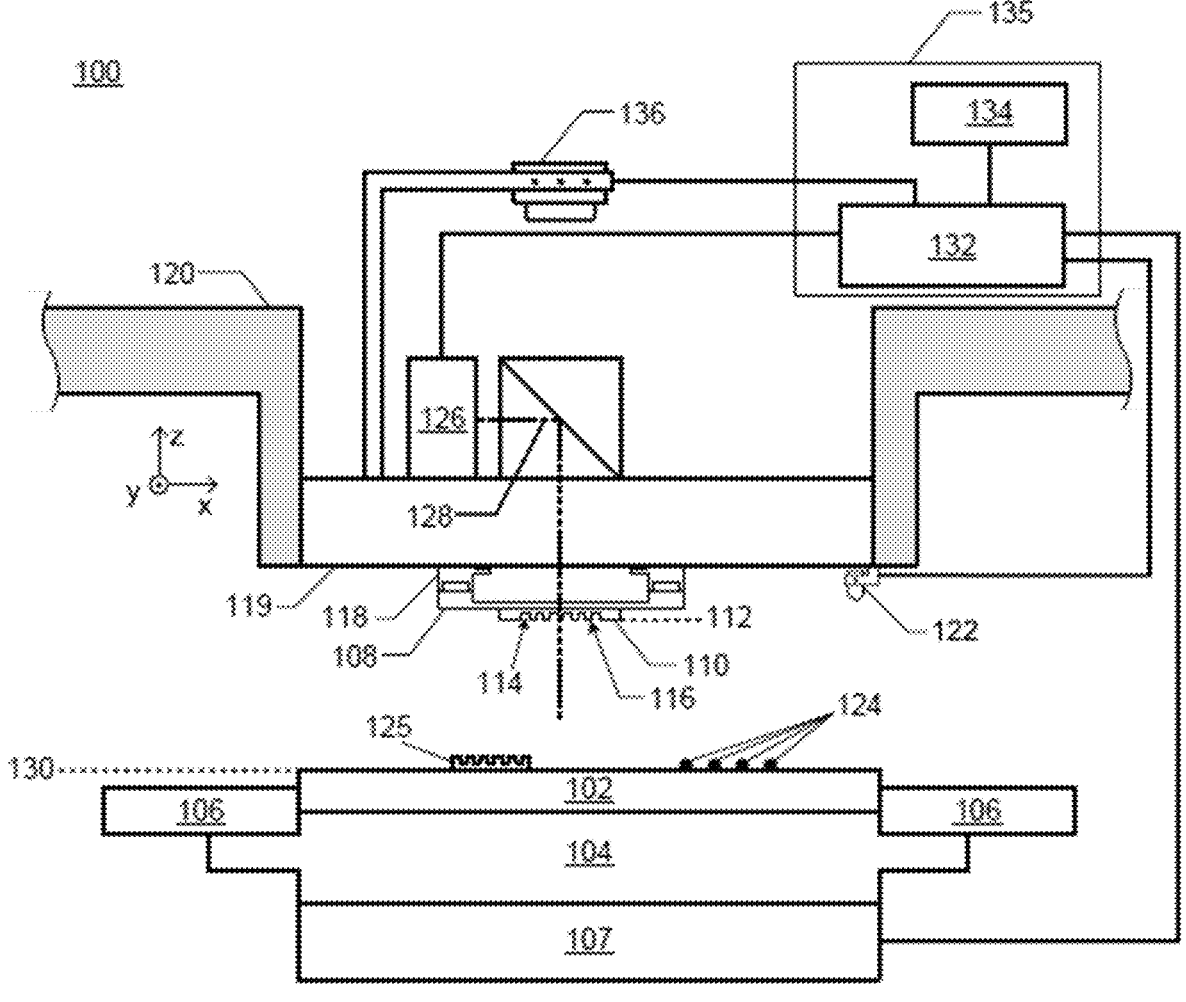
FIG. 1 illustrates an example embodiment of a nanoimprint lithography system.

The following paragraphs describe certain explanatory embodiments. Other embodiments may include alternatives, equivalents, and modifications. Additionally, the explanatory embodiments may include several features, and a particular feature may not be essential to some embodiments of the devices, systems, and methods that are described herein. Furthermore, some embodiments include features from two or more of the following explanatory embodiments.

Also, as used herein, the conjunction "or" generally refers to an inclusive "or," though "or" may refer to an exclusive "or" if expressly indicated or if the context indicates that the "or" must be an exclusive "or."

Furthermore, in this description and the drawings, an alphabetic suffix on a reference number may be used to indicate a specific instance of the feature identified by the reference numeral. For example, the cells in a group of cells may be identified with the reference numeral 165 when a particular cell is not being distinguished. However, 165A may be used to identify a specific cell when the specific cell is being distinguished from the rest of the cells 165.

FIG. 1 illustrates an example embodiment of a nanoimprint lithography system 100. When operating, the nanoimprint lithography system 100 deposits drops 124 of formable material (e.g., resist) on a substrate 102 (e.g., a wafer) and forms a patterned layer 125, which has a relief pattern, in the formable material in an imprint field on the substrate 102 by using a template 108, that has a mesa (also referred to as a mold) 110 that has a patterning surface 112, to imprint the formable material on the substrate 102. A single mesa 110 may be used to imprint formable material in a plurality of imprint fields on a single substrate 102 or a plurality of substrates 102.

In the embodiment in FIG. 1, the perimeter of the substrate 102 is surrounded by an applique 106. The applique 106 may be configured to stabilize the local gas environment beneath the template 108 and/or help protect the patterning surface 112 from particles, for example when the template is not above the substrate surface 130. Furthermore, an upper surface of the applique 106 may be below (e.g., as shown in FIG. 1) or coplanar with the substrate surface 130.

Also, the substrate 102 is coupled to a substrate chuck 104, which also supports the applique 106. Examples of substrate chucks 104 include the following: vacuum chucks, pin-type chucks, groove-type chucks, electrostatic chucks, and electromagnetic chucks. In some embodiments, such as the embodiment shown in FIG. 1, the applique 106 is mounted on the substrate chuck 104 without any part of the applique being sandwiched between the substrate chuck 104 and the substrate 102. The substrate chuck 104 is supported by the substrate positioning stage 107.

The substrate positioning stage 107 may provide translational or rotational motion along one or more of the x, y, z, θ, and φ-axes. The substrate positioning stage 107, the substrate 102, and the substrate chuck 104 may also be positioned on a base (not shown). Additionally, the substrate positioning stage 107 may be a part of a positioning system or a positioning subsystem.

The nanoimprint lithography system 100 also includes a template 108. The template 108 may include a body that includes the mesa 110 (also referred to as a mold), which extends toward the substrate 102 along the z axis. The mesa 110 may have a patterning surface 112 thereon. Also, the template 108 may be formed without the mesa 110. Thus, in some embodiments, the surface of the template 108 that faces the substrate 102 functions as the mesa 110, and the patterning surface 112 is included on the surface of the template 108 that faces the substrate 102. Examples of materials that may constitute the template 108 or the mesa 110 include the following: fused-silica, quartz, silicon, organic polymers, siloxane polymers, borosilicate glass, fluorocarbon polymers, metal, and hardened sapphire.

The patterning surface 112 has features that are defined by a plurality of spaced-apart template recesses 114 or template protrusions 116, though some embodiments include other configurations (e.g., a planar surface). The patterning surface 112 defines a pattern that forms the basis (e.g., an inverse) of the relief pattern of the patterned layer 125, which is formed from the drops 124 of formable material on the substrate 102. In some embodiments, the patterning surface 112 is featureless, in which case a planar surface is formed from formable material on the substrate 102. In some embodiments (e.g., embodiments that perform Inkjet-based Adaptive Planarization), the patterning surface 112 is featureless and the substantially the same size as the substrate 102, in which case a planar surface is formed from formable material across the entire substrate 102.

The template 108 may be coupled to a template chuck 118. Examples of template chucks 118 include the following: vacuum chucks, pin-type chucks, groove-type chucks, electrostatic chucks, and electromagnetic chucks. The template chuck 118 may be configured to apply a force to the template 108 that varies across the template 108. The template chuck 118 may be coupled to an imprint head 119, which in turn may be moveably coupled to a bridge 120 such that the template chuck 118, the imprint head 119, and the template 108 are moveable in at least the z-axis direction. In some embodiments, the template chuck 118, the imprint head 119, and the template 108 are also movable in one or more of the x, y, θ, and φ-axes directions. The nanoimprint lithography system 100 may include one or more motors that move the template 108, the template chuck 118, or the imprint head 119.

The nanoimprint lithography system 100 also includes a fluid dispenser 122. The fluid dispenser 122 may also be moveably coupled to the bridge 120. In some embodiments, the fluid dispenser 122 and the template chuck 118 share one or more positioning components. And in some embodiments, the fluid dispenser 122 and the template chuck 118 move independently of each other.

When operating, the fluid dispenser 122 deposits drops 124 of liquid formable material onto the substrate 102 according to a drop pattern. The formable material may be, for example, a resist (e.g., photo resist) or another polymerizable material, and the formable material may comprise a mixture that includes a monomer. The fluid dispenser 122 may include multiple nozzles (e.g., hundreds) offset from each other with a certain distance between adjacent nozzles. As a result of the structural layout of the nozzles, the dispenser head can dispense drops at a particular distance from each other, for example 35 microns. An example of the layout of the nozzles of a fluid dispenser, and the distance between adjacent dispensable drop positions, is described in U.S. Pat. No. 11,215,921 (hereinafter "the '921 patent), and in particular, FIGS. 4A to 4D, column 12, line 4 to column 15, line 63, which is hereby incorporated by reference herein.

The drops 124 of formable material may be dispensed upon the substrate 102 before or after a desired volume is defined between the patterning surface 112 and the substrate 102, depending on design considerations. Different fluid dispensers 122 may use different technologies to dispense the drops 124. When the formable material is jettable, ink-jet-type fluid dispensers 122 may be used to dispense the drops 124 of formable material. For example, thermal ink jetting, microelectromechanical-systems-based (MEMS-based) ink jetting, and piezoelectric ink jetting are technologies for dispensing jettable liquids.

Furthermore, additional formable material may be added to the substrate 102 using various techniques, for example drop dispense, spin-coating, dip coating, chemical vapor deposition (CVD), physical vapor deposition (PVD), thin film deposition, thick film deposition, or the like.

The nanoimprint lithography system 100 also includes an energy source 126 that directs actinic energy along an exposure path 128. The imprint head 119 and the substrate positioning stage 107 may be configured to position the template 108 and the substrate 102 on (e.g., in superimposition with) the exposure path 128. A camera 136 may likewise be positioned such that an imaging field of the camera 136 is in superimposition with at least part of the exposure path 128.

Once the drops 124 of formable material have been deposited on the substrate, either the imprint head 119, the substrate positioning stage 107, or both varies a distance between the mesa 110 and the substrate 102 to define a desired field volume that is filled by the formable material. For example, the imprint head 119 may apply a force to the template 108 that moves the mesa 110 into contact with the drops 124 of formable material that are on the substrate 102. After the desired field volume is filled with the formable material, the energy source 126 produces energy (e.g., actinic radiation (UV)) that is directed along the exposure path 128 to the formable material and that causes the formable material to cure, solidify, or cross-link in conformance to a shape of the substrate surface 130 and the patterning surface 112, thereby defining a patterned layer 125 on the substrate 102. The formable material is cured while the template 108 is in contact with the formable material, thereby forming the patterned layer 125 on the substrate 102. Thus, the nanoimprint lithography system 100 uses an imprinting process to form the patterned layer 125, which has recesses and protrusions that are an inverse of the pattern in the patterning surface 112.

The imprinting process may be done repeatedly in a plurality of imprint fields (e.g., the imprint fields 141 in FIG. 2) that are spread across the substrate surface 130. For example, each of the imprint fields may be the same size as the mesa 110 or the same size as only the pattern area 115 of the mesa 110. The pattern area 115 of the mesa 110 is a region of the patterning surface 112 that is used to imprint patterns on a substrate 102 (e.g., a region that includes the template recesses 114 and the template protrusions 116). The pattern area 115 of the mesa 110 may include fluid control features that are used to prevent extrusions. In some embodiments, the substrate 102 has only one imprint field, and the imprint field is the same size as the substrate 102 or as the area of the substrate 102 which is to be patterned with mesa 110. Also, in some embodiments, the imprint fields overlap. Some of the imprint fields may be partial imprint fields which intersect a boundary of the substrate 102.

The patterned layer 125 may be formed such that it has a residual layer that has a residual layer thickness (RLT) above a highest point on the substrate surface 130 in each imprint field. The patterned layer 125 may also include one or more features, such as protrusions, that extend above the residual layer. These protrusions match the recesses 114 in the patterning surface 112 of the mesa 110.

The patterned layer 125 can be further subjected to known steps and processes for article (e.g., device) fabrication. A non-limiting list of examples of processes for article fabrication are: curing, oxidation, layer formation, deposition, doping, planarization, etching, formable material removal, dicing, bonding, packaging, and the like. A non-limiting list of examples of articles include CMOS logic, microprocessors, NAND Flash memory, NOR Flash memory, DRAM memory, MRAM, 3D cross-point memory, Re-RAM, Fe-RAM, STT-RAM, MOEMS, microfluidic devices, and MEMS.

The nanoimprint lithography system 100 may be regulated, controlled, or directed by one or more processors 132 (e.g., controllers) in communication with one or more other components or subsystems, such as the substrate positioning stage 107, the imprint head 119, the fluid dispenser 122, the energy source 126, or the camera 136, and may operate based on instructions in a computer-readable program stored in one or more non-transitory computer-readable media 134. In some embodiments, including the embodiment in FIG. 1, the one or more processors and the one or more non-transitory computer-readable media 134 are included in a nanoimprint-lithography-control device 135. The nanoimprint-lithography-control device 135 regulates, controls, or directs the operations of the nanoimprint lithography system 100.

Each of the one or more processors 132 may be or may include one or more of the following: a central processing units (CPU), which may include microprocessors (e.g., a single core microprocessor, a multi-core microprocessor); a graphics processing unit (GPUs); an application-specific integrated circuit (ASIC); a field-programmable-gate array (FPGA); a digital signal processors (DSP); a specially-configured computer; and other electronic circuitry (e.g., other integrated circuits). For example, a processor 132 may be a purpose-built controller or may be a general-purpose controller that has been specially-configured to be a nanoimprint-lithography-system controller.

Examples of non-transitory computer-readable media include, but are not limited to, a magnetic disk (e.g., a floppy disk, a hard disk), an optical disc (e.g., a CD, a DVD, a Blu-ray), a magneto-optical disk, magnetic tape, semiconductor memory (e.g., a non-volatile memory card, flash memory, a solid-state drive, SRAM, DRAM, EPROM, EEPROM), a networked attached storage (NAS), an intranet-connected non-transitory computer-readable storage device, and an internet-connected non-transitory computer-readable storage device.

In the embodiment in FIG. 1, the nanoimprint-lithography-control device 135 may generate one or more drop patterns, and the nanoimprint-lithography-control device 135 may obtain the one or more drop patterns from another device (e.g., a drop-pattern-generation device) that generated the one or more drop patterns. For example, the one or more processors 132 may be in communication with a networked computer on which analysis is performed and control files, such as a drop pattern, are generated. A drop pattern indicates where the fluid dispenser 122 should deposit drops 124 of liquid formable material onto the substrate 102. A drop pattern may be generated based on a field volume and on imprint-field features. The field volume indicates the volume of formable material required to produce all of the desired features of the patterned layer 125 (e.g., all of the features of the patterned layer 125 in an imprint field). Also, to account for imprint-field features, the density of the drop pattern may vary across the imprint field. And the drop pattern may have a uniform drop density over regions of the imprint field that have a uniform density (e.g., blank areas, or areas where the imprint-field features have a uniform feature density).

Figure 2:
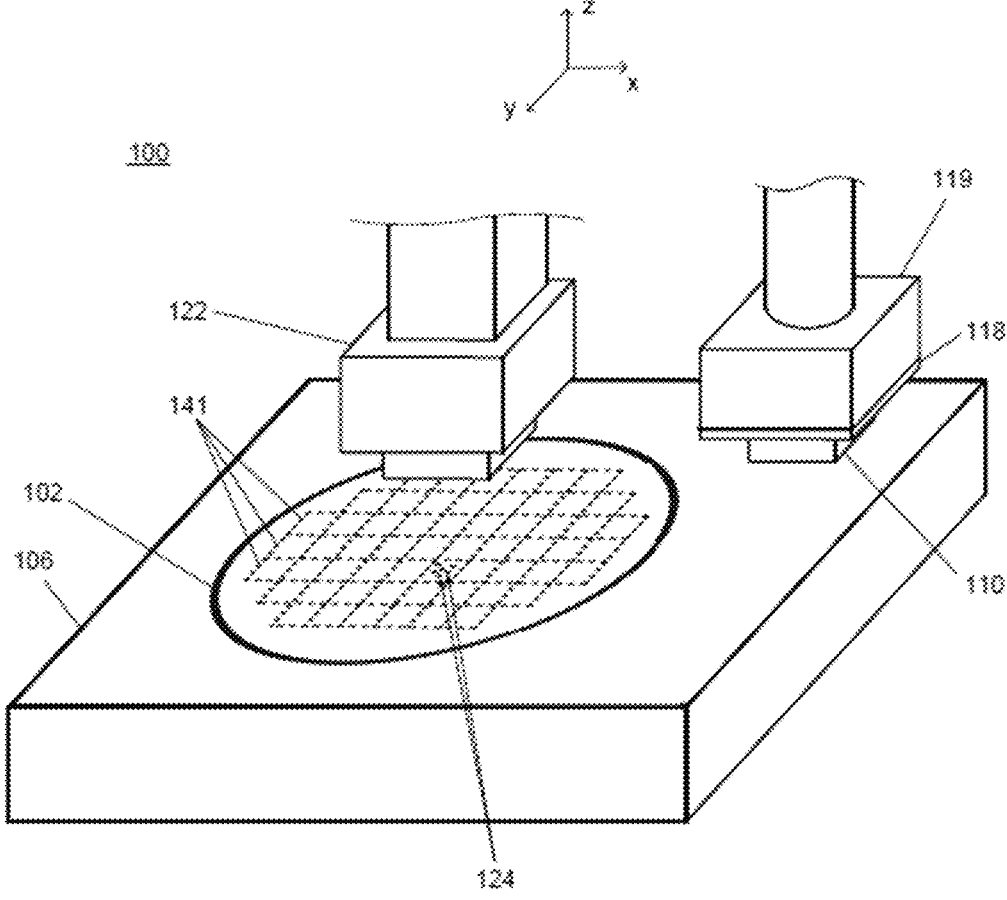
FIG. 2 illustrates a perspective view of an example embodiment of a nanoimprint lithography system.

FIG. 2 illustrates a perspective view of an example embodiment of a nanoimprint lithography system 100. This embodiment of a nanoimprint lithography system 100 includes a substrate 102, an applique 106, a fluid dispenser 122, a mesa 110, a template chuck 118, and an imprint head 119. Also, FIG. 2 illustrates a plurality of imprint fields 141 on the substrate 102. Additionally, the fluid dispenser 122 has deposited drops 124 of formable material on one of the imprint fields 141.

Figure 3:
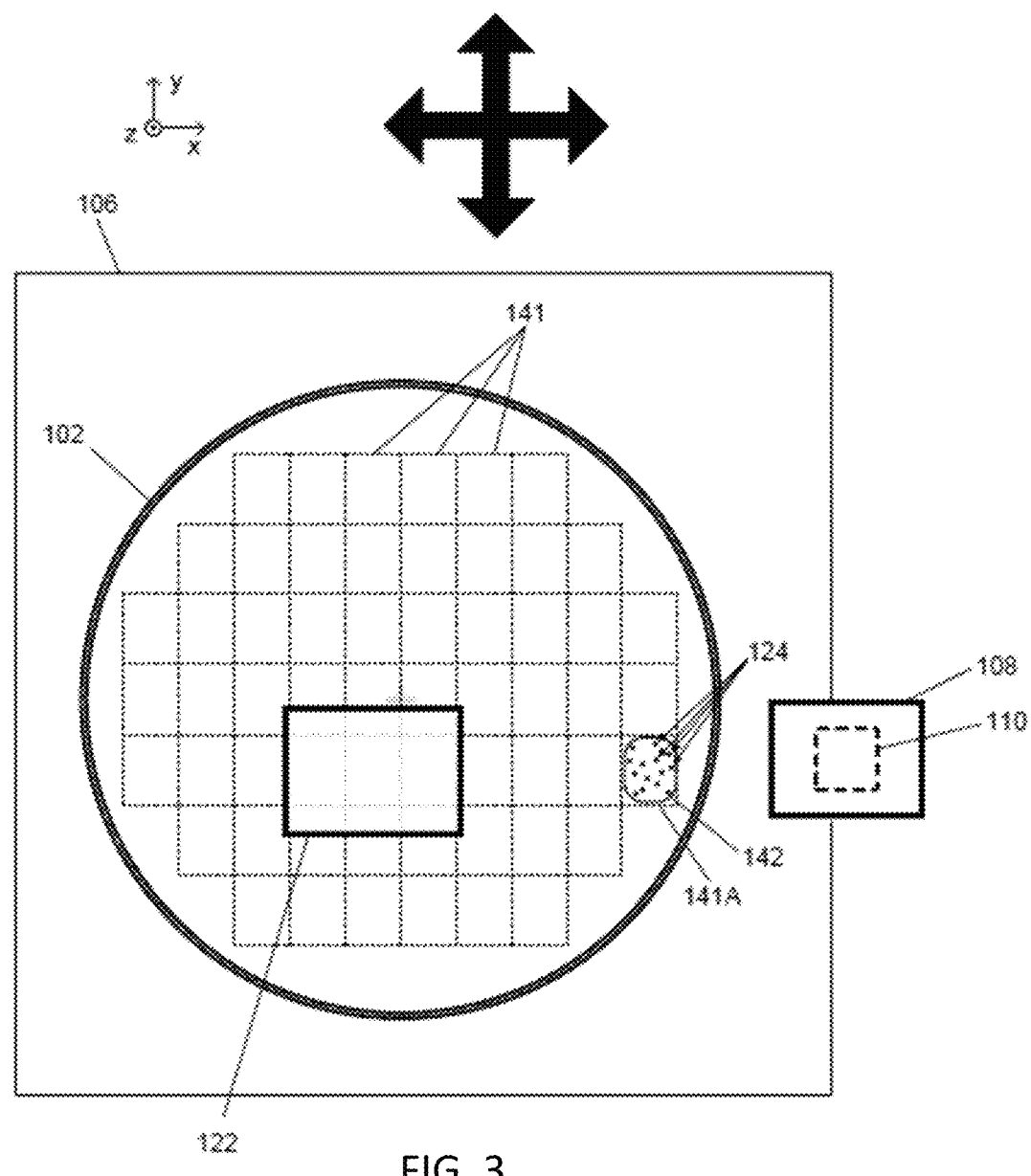
FIG. 3 illustrates a plan view (a view from along the z axis) of an example embodiment of a substrate, an applique, a fluid dispenser, a template, and a drop pattern.

FIG. 3 illustrates a plan view (a view from along the z axis) of an example embodiment of a substrate 102, an applique 106, a fluid dispenser 122, a template 108, and a drop pattern 142. The template 108 includes a mesa 110. The substrate 102 in FIG. 3 includes a plurality of imprint fields 141. On each of the imprint fields 141, a respective pattern may be formed from formable material (e.g., a patterned layer or a planar layer). The substrate positioning stage that supports the applique 106 and the substrate 102 can move the applique 106 and the substrate 102 along both the x axis and the y axis. This allows the substrate positioning stage to position each of the imprint fields 141 under the fluid dispenser 122, which deposits drops of formable material on the imprint field 141, and then under the template 108, which forms a pattern (e.g., a patterned layer) in the formable material that was deposited on the imprint field 141. In some embodiments, there is only one imprint field on the substrate surface.

When an imprint field 141 is positioned under the fluid dispenser 122, the fluid dispenser 122 can deposits drops 124 of formable material on the imprint field 141. For example, FIG. 3 shows an imprint field 141A on which drops 124 of formable material have been deposited by the fluid dispenser 122 according to a drop pattern 142. In some embodiments, the fluid dispenser 122 deposits the drops 124 on each of the imprint fields 141A-C according to the same drop pattern 142. However, in some embodiments, the fluid dispenser 122 uses different drop patterns for some of the imprint fields 141.

Figure 4:
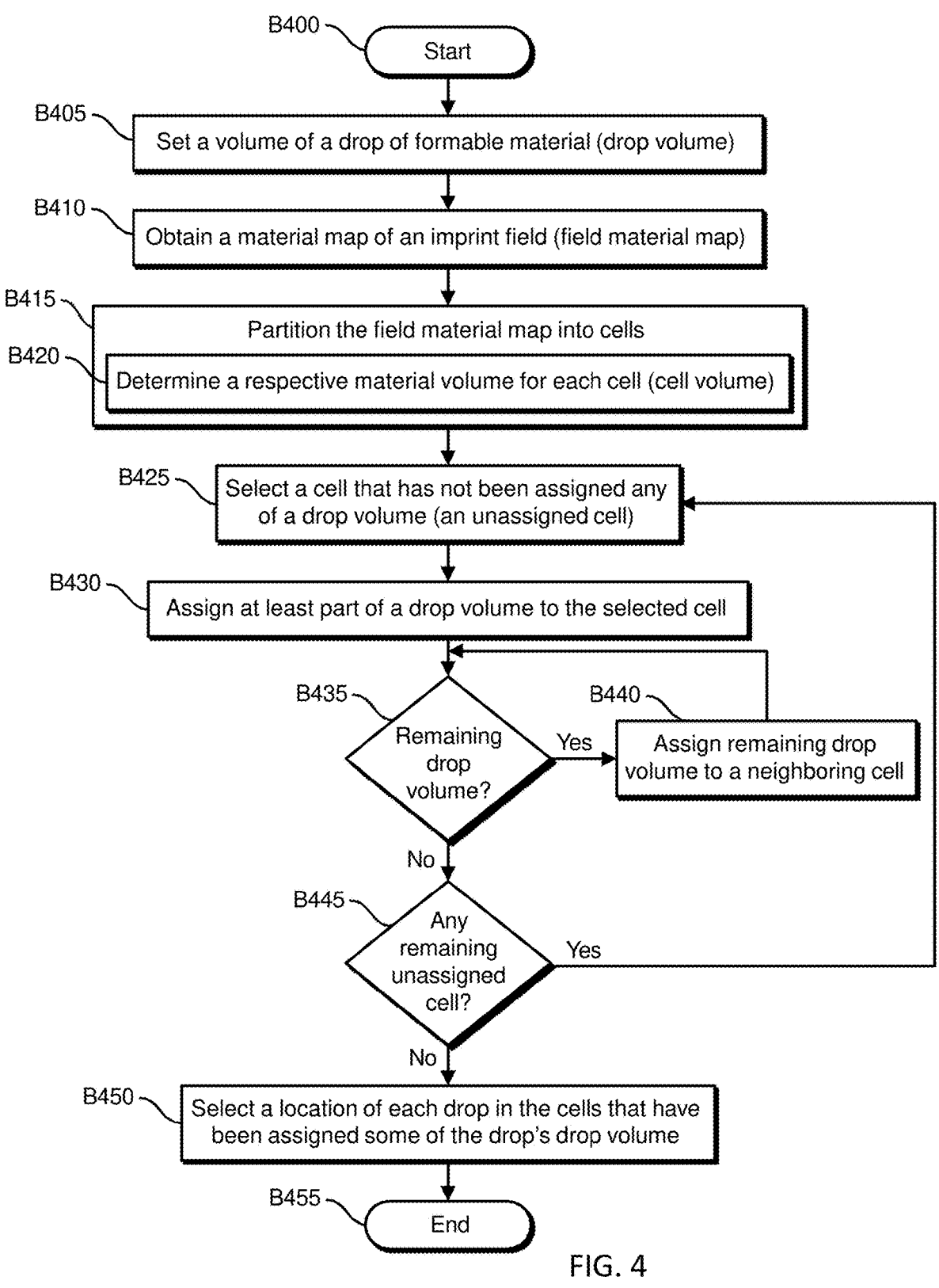
FIG. 4 illustrates an example embodiment of an operational flow for generating a drop pattern.

FIG. 4 illustrates an example embodiment of an operational flow for generating a drop pattern. Although this operational flow and the other operational flows that are described herein are each presented in a certain respective order, some embodiments of these operational flows perform at least some of the operations in different orders than the presented orders. Examples of different orders include concurrent, parallel, overlapping, reordered, simultaneous, incremental, and interleaved orders. Also, some embodiments of these operational flows include operations (e.g., blocks) from more than one of the operational flows that are described herein. Thus, some embodiments of the operational flows may omit blocks, add blocks (e.g., include blocks from other operational flows that are described herein), change the order of the blocks, combine blocks, or divide blocks into more blocks relative to the example embodiments of the operational flows that are described herein.

Furthermore, although this operational flow and the other operational flows that are described herein are performed by a drop-pattern-generation device, some embodiments of these operational flows are performed by two or more drop-pattern-generation devices or by one or more other specially-configured computing devices (e.g., a nanoimprint-lithography-control device).

Figure 5:
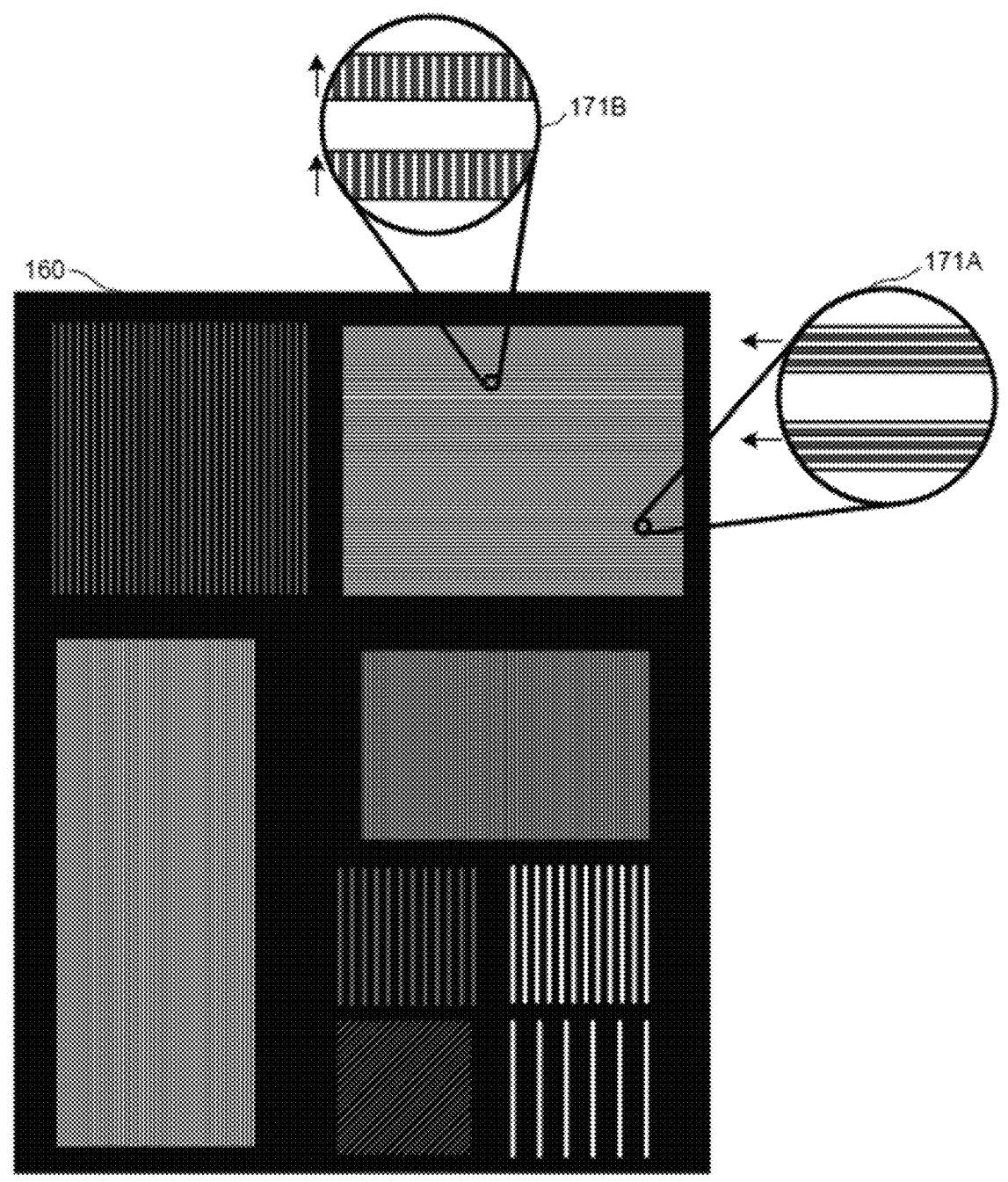
FIG. 5 illustrates an example embodiment of a field material map.

In FIG. 4, the flow starts in block B400 and then proceeds to block B405, where the drop-pattern-generation device sets or obtains (e.g., retrieves, receives) a volume of a drop of formable material (drop volume), which indicates the volume of formable material in a single drop. The volume of a single drop may be for example from 0.3 picoliters to 3 picoliters. Depending on the components (e.g., fluid dispenser) of the corresponding nanoimprint lithography system, the drop volume may have a range of possible volumes (e.g., be adjustable), or the drop volume may have a fixed volume. Next, in block B410, the drop-pattern-generation device obtains a material map of one or more imprint fields (a field material map). The field material map may cover an entire substrate, may describe only a single imprint field, or may describe a plurality of imprint fields. For example, a field material map may be an image (e.g., bitmap, PNG) in which the respective value of each tile (e.g., pixel) indicates a volume of imprint material (e.g., a thickness of a patterned layer, such as the patterned layer 125 in FIG. 1). The field material map may also include information about the direction of spread of drops which is influenced by an average orientation of features within each tile. FIG. 5 illustrates an example embodiment of a field material map 160. The different shades in the field material map 160 indicate the respective volumes of imprint material at the locations of the tiles.

Next, in block B415, the drop-pattern-generation device partitions the field material map into a plurality of cells. For example, some embodiments of the drop-pattern-generation device overlay a set (e.g., array, grid, tessellation) of cells on the field material map. The sizes of the cells influence the resolution of the drop pattern and the speed with which the drop-pattern-generation device can generate the drop pattern. Also, the cells may have various shapes (e.g., square, rectangle, triangle, hexagon, octagon, irregular polygons), although, in the following example embodiments, the cells have a hexagonal shape. In some embodiments, not all of the cells have the same shape—thus, different shapes are used together.

Figure 6:
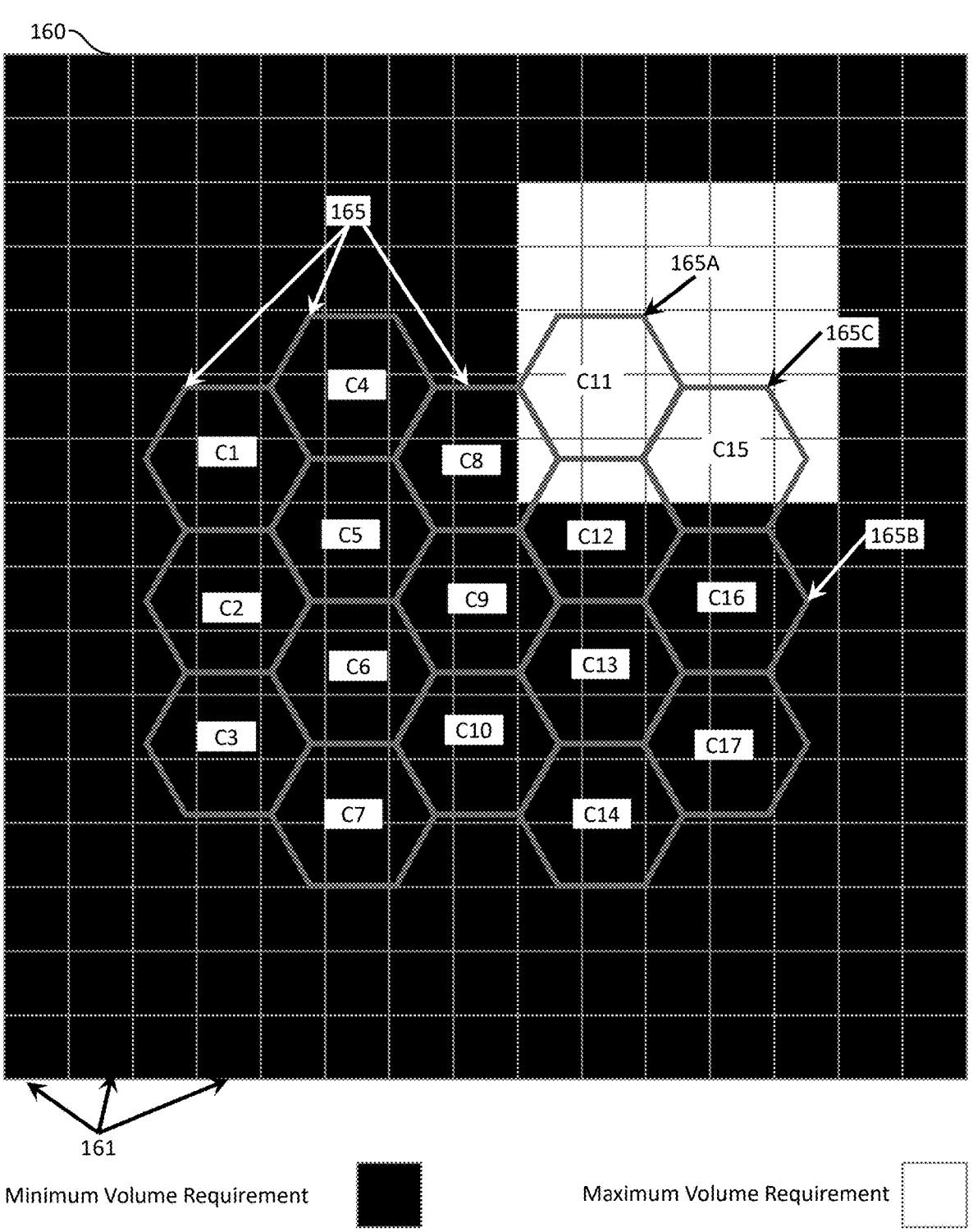
FIG. 6 illustrates an example embodiment of a set of cells overlaid on a field material map.

FIG. 6 illustrates an example embodiment of a set of cells overlaid on a field material map. The field material map 160 includes 15×16 tiles 161, and the black and white background of each tile 161 in the field material map 160 indicates the volume of formable material at the location of the tile 161. The black tiles 161 in the field material map represent a minimum volume requirement while the white tiles 161 represent the maximum volume requirement.

Also, in this embodiment, each cell 165 in the set of cells 165 has a hexagonal shape. The hexagonal shape may improve the quality of the resulting drop patterns because rectangular and diamond shapes may be a suboptimal representation of the drop-spreading geometry, which can be more circular than rectangular. Using hexagonal cells instead of rectangular or diamond-shaped cells, the circular nature of the drop spreading may be better replicated. Also, in some drop patterns, the absolute majority of drops have exactly six abutting neighbor drops, which would occur naturally if each drop region is composed of a set of contiguous hexagonally-shaped cells.

Furthermore, block B415 includes block B420. In block B420, the drop-pattern-generation device determines a respective material volume for each cell (cell volume) and marks each cell as an unassigned cell. A cell volume indicates the volume of formable material that is to be assigned to cell (e.g., assigned in block B430 or in block B440). In some embodiments, the cell volume of a cell is determined to be the sum of the volume of formable material in the areas of the tiles in a field material map that are overlaid by the cell. For example, referring to FIG. 6, if the area of a cell 165A is completely filled with white tiles, then that cell has the maximum volume of formable material. The area of the cell 165B is completely filled with black cells and has a minimum volume of formable material. The area of the cell 165C is filled with both black and white cells and has an intermediate volume of formable material. Thus, a tile that is overlaid by multiple cells may have its formable-material volume distributed among all of the overlaying cells, with the fraction of the formable-material volume going to a particular cell equaling the fraction of the tile's area overlaid by the particular cell. Also, the total volume assigned to all of the cells will then be equal to the total volume of all the tiles (and thus equal to the total volume in the field material map). The volume of a single cell may be from 0.02 femtoliters to 300 femtoliters.

The flow then moves to block B425, where the drop-pattern-generation device selects an unassigned cell, which is a cell that has not been assigned any part of a drop volume.

Next, in block B430, the drop-pattern-generation device assigns at least part of a drop volume to the selected cell and marks the selected cell as assigned. The drop volume that is assigned to the selected cell is the selected cell's cell volume (e.g., from block B420). The cell volume is less than the drop volume (the cell volume is set so that the largest cell volume is less than the drop volume—the drop volume may be substantially larger than the largest cell volume), a part of the drop volume that is equal to the cell volume is assigned to the selected cell, and a part of the drop volume will remain unassigned.

The flow then moves to block B435, where the drop-pattern-generation device determines if any of the drop volume from block B430 remains unassigned. If the drop-pattern-generation device determines that some of the drop volume from block B430 remains unassigned (B435=Yes), then the flow moves to block B440. In block B440, the drop-pattern-generation device assigns at least some of the remaining drop volume to an unassigned neighboring cell and marks the neighboring cell as assigned. From block B440, the flow returns to block B435. In blocks B435-B440, the drop-pattern-generation device may assign a part of the drop volume that is equal to a neighboring cell's cell volume and then move to another neighboring cell if part of the drop volume remains unassigned, thereby visiting multiple neighboring cells until all of the drop volume has been assigned to a cell.

Also, if the drop-pattern-generation device determines that none of the drop volume from block B430 remains unassigned (B435=No), then the flow moves to block B445.

In block B445, the drop-pattern-generation device determines if there is any remaining unassigned cells. If the drop-pattern-generation device determines that one or more unassigned cells remain (B445=Yes), then the flow returns to block B425. If the drop-pattern-generation device determines that no unassigned cells remain (B445=No), then the flow moves to block B450.

In block B450, the drop-pattern-generation device computes (or otherwise determines) a location of each drop in the cells that have been assigned some of the drop's drop volume. The cells that have been assigned some of a drop's drop volume may be referred to as a drop region. For example, if three cells have been assigned part of a drop's drop volume (the three cells compose the drop region), then the drop-pattern-generation device computes a location within the three cells for the drop. This location indicates where the drop is to be placed in a drop pattern. The drop-pattern-generation device outputs or stores the locations of the drops, which define a drop pattern. Additional details of how to assign the location of the drop in the overall drop pattern is discussed below with respect to FIG. 10. Then the flow ends in block B455.

Figure 7:
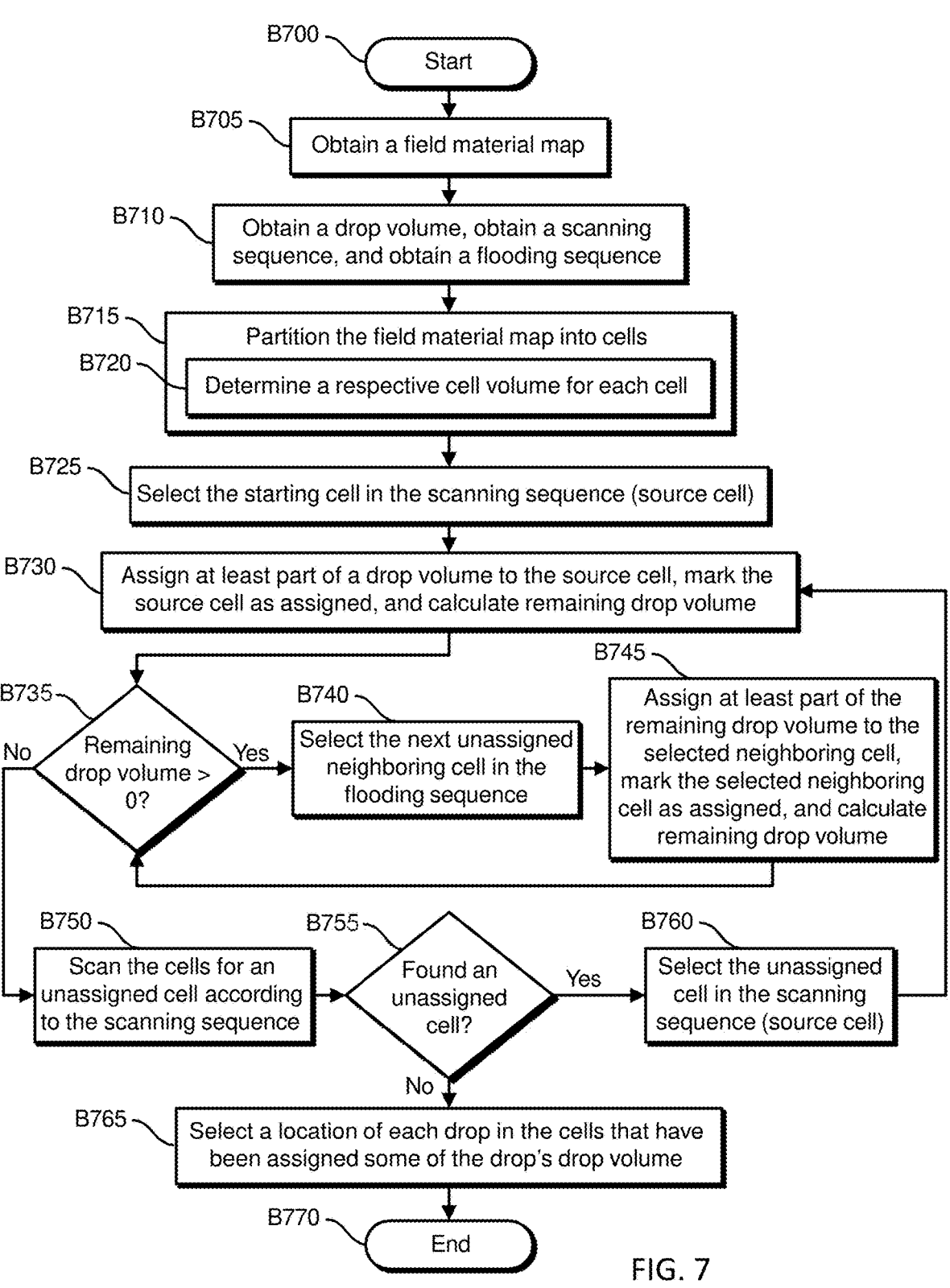
FIG. 7 illustrates an example embodiment of an operational flow for generating a drop pattern.

FIG. 7 illustrates an example embodiment of an operational flow for generating a drop pattern. The flow starts in block B700 and then moves to block B705, where a drop-pattern-generation device obtains a field material map. Next, in block B710, the drop-pattern-generation device sets or obtains (e.g., receives from a user input, retrieves from a memory device) a drop volume, obtains a scanning sequence, and obtains a flooding sequence.

A scanning sequence defines a sequence or order that the drop-pattern-generation device will use to scan a set of cells for any unassigned cells. Example scanning sequences are disclosed in the '055 patent, and in particular, FIGS. 8A-9D and the corresponding description, which is hereby incorporated by reference herein in its entirety.

Referring again to FIG. 7, after block B710, the flow moves to block B715. In block B715, the drop-pattern-generation device partitions the field material map into cells. Block B715 includes block B720, where the drop-pattern-generation device determines a respective cell volume for each cell. The flow then moves to block B725, where the drop-pattern-generation device selects the starting cell in the scanning sequence that was obtained in block B710. A cell that has been selected according to the scanning sequence may be referred to herein as a source cell. Then, in block B730, the drop-pattern-generation device assigns at least part of a drop volume to the source cell and marks the source cell as assigned. If the drop volume is less than or equal to the cell volume, then the drop-pattern-generation device assigns all of the drop volume to the source cell. If the drop volume is greater than the cell volume, then the drop-pattern-generation device assigns a part of the drop volume that is equal to the cell volume to the source cell. Also, the drop-pattern-generation device calculates the remaining drop volume by subtracting the cell volume of the source cell from the drop volume. The flow then moves to block B735, where the drop-pattern-generation device determines if the remaining drop volume is greater than zero. If the drop-pattern-generation device determines that the remaining drop volume is greater than zero (B735=Yes), then the flow moves to block B740.

In block B740, the drop-pattern-generation device selects the next unassigned neighboring cell of the source cell in the flooding sequence. Then, in block B745, the drop-pattern-generation device assigns at least part of the remaining drop volume to the selected neighboring cell and marks the selected neighboring cell as assigned. If the remaining drop volume is less than or equal to the cell volume of the selected neighboring cell, then the drop-pattern-generation device assigns all of the remaining drop volume to the selected neighboring cell. If the remaining drop volume is greater than the cell volume of the selected neighboring cell, then the drop-pattern-generation device assigns a part of the remaining drop volume that is equal to the cell volume of the selected neighboring cell to the selected neighboring cell. Also, the drop-pattern-generation device calculates the remaining drop volume by subtracting the cell volume of the selected neighboring cell from the remaining drop volume. The flow then returns to block B735.

If the drop-pattern-generation device determines that the remaining drop volume is not greater than zero (B735=No), then the flow moves to block B750. In block B750, the drop-pattern-generation device scans the cells for an unassigned cell according to the scanning sequence. Next, in block B755, the drop-pattern-generation device determines if it found an unassigned cell while it scanned the cells according to the scanning sequence. If the drop-pattern-generation device determines that it did find an unassigned cell (B755=Yes), then the flow moves to block B760. Starting from the source cell that was selected in block B725 or in the most-recent previous iteration of block B760, the unassigned cell will be the first unassigned cell in the scanning sequence. In block B760, the drop-pattern-generation device selects the unassigned cell, which thus becomes a source cell. The flow then returns to block B730.

If the drop-pattern-generation device determines that it did not find an unassigned cell in block B755 (B755=No), then the flow moves to block B765. In block B765, for each drop, the drop-pattern-generation device computes a location of the drop in the drop region (the cells that have been assigned some of the drop's drop volume). Also, the drop-pattern-generation device outputs or stores the locations of the drops, which define a drop pattern. Additional details of how to assign the location of the drop in the overall drop pattern is discussed below with respect to FIG. 10. The flow then ends in block B770.

Figure 8:
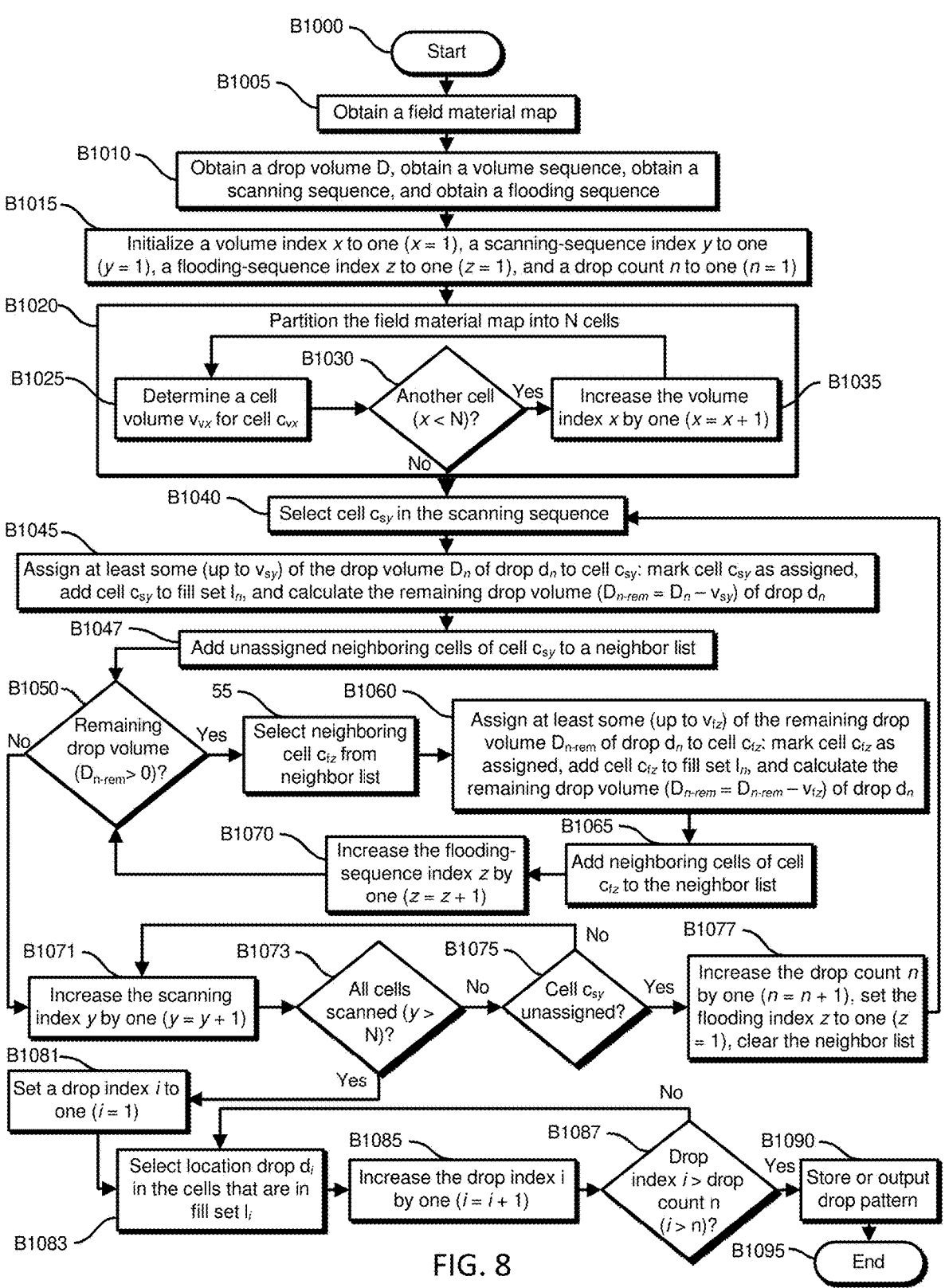
FIG. 8 illustrates an example embodiment of an operational flow for generating a drop pattern.

FIG. 8 illustrates an example embodiment of an operational flow for generating a drop pattern. The flow starts in block B1000 and then moves to block B1005, where a drop-pattern-generation device obtains a field material map. Next, in block B1010, the drop-pattern-generation device obtains a drop volume D, obtains a volume sequence, obtains a scanning sequence, and obtains a flooding sequence. The volume sequence defines the order in which the drop-pattern-generation device determines respective volumes for cells. The flow then moves to block B1015, where the drop-pattern-generation device initializes a volume index x to one (x=1), a scanning-sequence index y to one (y=1), a flooding-sequence index z to one (z=1), and a drop count n to one (n=1) The drop count n is also the index used to identify a particular drop in the drop pattern.

Next, in block B1020, the drop-pattern-generation device partitions the field material map into N cells (where N is a positive integer). Block B1020 includes blocks B1025-B1035, in which the drop-pattern-generation device determines the cell volumes of the cells according to the volume sequence. In block B1025, the drop-pattern-generation device determines a cell volume $v_{vx}$ for cell $c_{vx}$ (where the subscript vx refers to the cell at index x in the volume sequence v).

Figure 9:
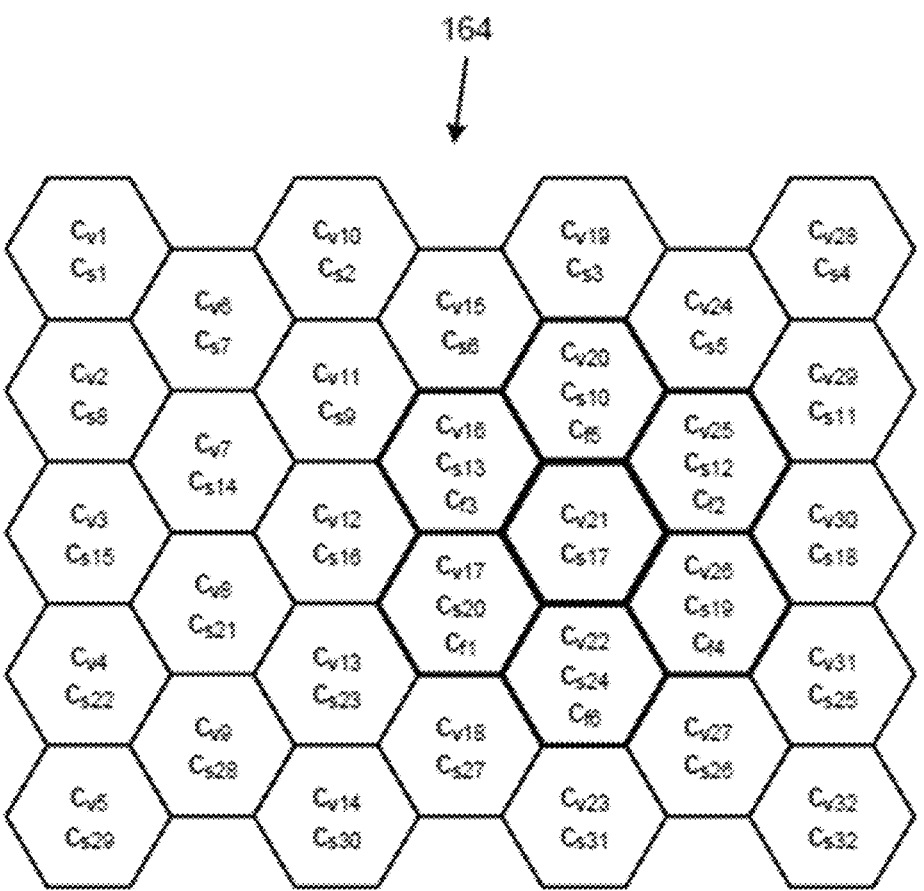
FIG. 9 illustrates example embodiments of volume indexes, scanning-sequence indexes, and flooding-sequence indexes.

Note that, although the volume index and the scanning sequence index both identify cells of the N cells (and thus each volume index has a corresponding scanning-sequence index that refers to the same cell), the volume sequence may progress though the cells in a different sequence (e.g., order, path) than the scanning sequence, for example as shown in FIG. 9, which illustrates example embodiments of volume indexes, scanning-sequence indexes, and flooding-sequence indexes. In FIG. 9, the volume sequence progresses through the cells in a set of cells 164 in a different order than the scanning sequence. Some cells (e.g., cell $c_{v1}/c_{s1}$ cell $c_{v32}/c_{s32}$) have the same volume index and scanning-sequence index. However, some cells have a volume index that is different from the cell's scanning-sequence index.

Thus, when the volume index x is identical to the scanning-sequence index y, cell $c_{vx}$ may not be the same cell as $c_{sy}$ (where the subscript sy refers to the cell at index y in the scanning-sequence s). Also, because cell $c_{vx}$ may not be the same cell as $c_{sy}$ when the volume index x is identical to the scanning-sequence index y, to distinguish between the volumes of cells that are referred to according to the volume index x and according to the scanning-sequence index y, the volumes of cells that are referred to according to the volume index x are denoted by $v_{vx}$, and the volumes of cells that are referred to according to the scanning-sequence index y are denoted by $v_{sy}$. But, when cell $c_{vx}$ is the same cell as cell $c_{sy}$ for particular values of the volume index x and the scanning-sequence index y (even if the volume index x is not identical to the scanning-sequence index y), then cell volume $v_{vx}$ is the same as cell volume $v_{sy}$. For example, in FIG. 9, cell volume $v_{s12}$ of cell $c_{v12}$ is the same as cell volume $v_{s16}$ of cell $c_{s16}$.

Also, the flooding sequence progresses though the cells in a different order then the scanning sequence and the volume sequence. Additionally, the flooding sequence is based on (e.g., uses as a point of reference) a selected cell, and thus the flooding sequence progresses though the cells in different orders when based on different selected cells. Furthermore, depending on the selected cell that is the basis of the flooding sequence, each cell can be referred to by multiple indexes in the flooding sequence.

For example, in FIG. 9, when cell $c_{v21}/c_{s17}$ (which is the $21^{st}$ cell in the volume sequence and the $17^{th}$ cell in the scanning sequence) is the selected cell (e.g., source cell), then cell $c_{v22}/c_{s24}$ is also cell $c_{f6}$ in the flooding sequence. However, if a different cell was the selected cell, then cell $c_{v22}/c_{s24}$ may have a different index in the flooding sequence.

Accordingly, to distinguish between the volumes of cells that are referred to according to the flooding-sequence index z, the volume index x, and the scanning-sequence index y, the volumes of cells that are referred to according to the flooding-sequence index z are denoted by $v_{fz}$ (where the subscript fz refers to the cell at index z in the flooding-sequence f). For example, the volume of cell $c_{v22}/c_{s24}/c_{f6}$ in FIG. 9 may be referred to by any of the following: $v_{v22}$, $v_{s24}$, and $v_{f6}$.

Then, in block B1030, the drop-pattern-generation device determines if there is a cell that does not have a determined cell volume (e.g., if x<N). If there is a cell that does not have a determined cell volume (B1030=Yes), then the flow proceeds to block B1035. In block B1035, the drop-pattern-generation device increases the volume index x by one, and then the flow returns to block B1025. If there is not a cell that does not have a determined volume (B1030=No), then the flow proceeds to block B1040.

In block B1040, the drop-pattern-generation device selects cell $c_{sy}$ (the cell at index y in the scanning sequence s) in the scanning sequence. Accordingly, cell $c_{sy}$ may be referred to as a source cell.

Then, in block B1045, the drop-pattern-generation device assigns at least some of the drop volume $D_n$ of drop $d_n$ to cell $c_{sy}$. In block B1045, the drop-pattern-generation device marks cell $c_{sy}$ as assigned; adds cell $c_{sy}$ to fill set $I_n$, which is a list of the cells that have been assigned part of the drop volume $D_n$ of drop $d_n$; and calculates the remaining drop volume $D_{n-rem}$ of drop $d_n$. In block B1045, the drop volume $D_n$ of drop $d_n$ is equal to the drop volume D that was obtained in block B1010. And, if the drop volume $D_n$ of drop $d_n$ is equal to or greater than the cell volume $v_{sy}$ of cell $c_{sy}$, then the drop-pattern-generation device assigns an amount of the drop volume $D_n$ that is equal to the cell volume $v_{sy}$ to cell $c_{sy}$. If the drop volume $D_n$ of drop $d_n$ is less than the cell volume $v_{sy}$ of cell $c_{sy}$, then the drop-pattern-generation device assigns all of the drop volume $D_n$ to cell $c_{sy}$.

Next, in block B1047, the drop-pattern-generation device adds the unassigned neighboring cells of cell $c_{sy}$ to a neighbor list according to the flooding sequence. Thus, the cells in the neighbor list are ordered in the same order in which they are visited by the flooding sequence. For example, if the flooding sequence is the flooding sequence in FIG. 9A, if cell $c_{s17}$ in FIG. 9 is the selected cell $c_{sy}$, and if cells $c_{s12}$, $c_{s10}$, $c_{s13}$, $cs_{20}$, $c_{s24}$, and $c_{s19}$ are all unassigned, then cells $c_{s12}$, $c_{s10}$, $c_{s13}$, $c_{s20}$, $c_{s24}$, and $cs_{19}$ would be added to the neighbor list in that order. Also for example, if cell $c_{s10}$ was assigned but the other five cells were unassigned, then cells $c_{s12}$, $c_{s13}$, $c_{s20}$, $c_{s24}$, and $c_{s19}$ would be added to the neighbor list in that order.

The flow then proceeds to block B1050, where the drop-pattern-generation device assigns determines if the remaining drop volume $D_{n-rem}$ is greater than zero. If the remaining drop volume $D_{n-rem}$ is greater than zero (B1050=Yes), then the flow moves to block B1055. In block B1055, the drop-pattern-generation device selects neighboring cell $c_{fz}$ of cell $c_{sy}$. For example, using an example from the previous paragraph, if cells $c_{s12}$, $c_{s10}$, $c_{s13}$, $c_{s20}$, $c_{s24}$, and $c_{s19}$ had been added to the neighbor list in that order and were the first cells in the neighbor list, then cell $c_{s12}$ would be cell $c_{f1}$ in the neighbor list.

Next, in block B1060, the drop-pattern-generation device assigns at least some of the remaining drop volume $D_{n-rem}$ of drop $d_n$ to neighboring cell $c_{fz}$. In block B1060, the drop-pattern-generation device marks neighboring cell $c_{fz}$ as assigned, adds cell $c_{fz}$ to fill set $I_n$, and calculates the remaining drop volume $D_{n-rem}$ of drop $d_n$. If the remaining drop volume $D_{n-rem}$ of drop $d_n$ is equal to or greater than the cell volume $v_{fz}$ of neighboring cell $c_{fz}$, then the drop-pattern-generation device assigns an amount of the remaining drop volume $D_{n-rem}$ that is equal to the cell volume $v_{fz}$ to neighboring cell $c_{fz}$. If the remaining drop volume $D_{n-rem}$ is less than the cell volume $v_{fz}$ of neighboring cell $c_{fz}$, then the drop-pattern-generation device assigns all of the remaining drop volume $D_{n-rem}$ to cell $c_{fz}$.

Then, in block B1065, the drop-pattern-generation device adds the unassigned neighboring cells of cell $c_{fz}$ to the neighbor list according to the flooding sequence. In block B1065, the unassigned neighboring cells of cell $c_{fz}$ may be added to the end of the neighbor list. The neighbors of cell $c_{fz}$ may be added to the neighbor list in an order determined by a flooding sequence that is based on the source cell S instead of being based on cell $c_{fz}$. Also, the flooding sequence may not be identical (in a relative sense) for each cell. Thus, in some embodiments, the drop-pattern-generation device obtains two or more flooding sequences and information that indicates which flooding sequence is used for each cell. In some such embodiments, neighboring cells of a neighboring cell are added to the neighbor list in an order determined by the flooding sequence of the source cell S. Alternatively, in some such embodiments, neighboring cells of a neighboring cell are added to the neighbor list in an order determined by the flooding sequence of the neighboring cell (e.g., the neighboring cells of cell $c_{fz}$ are added to the neighbor list in an order determined by the flooding sequence of cell $c_{fz}$). Furthermore, in some such embodiments, neighboring cells of a neighboring cell are added to the neighbor list in an order determined by the flooding sequences of both the source cell and the neighboring cell (e.g., the neighboring cells of cell $c_{fz}$ are added to the neighbor list in an order determined by the flooding sequences of cells S and $c_{fz}$).

The flow then moves to block B1070. In block B1070, the drop-pattern-generation device increases the flooding-sequence index z by one, and then the flow returns to block B1050.

If, in block B1050, the remaining drop volume $D_{n-rem}$ is not greater than zero (B1050=No), then the flow moves to block B1071. In block B1071, the drop-pattern-generation device increases the scanning index y by one. Next, in block B1073, the drop-pattern-generation device determines whether all of the cells have been scanned (e.g., if the scanning index y is greater than N). If the drop-pattern-generation device determines that all of the cells have not been scanned (B1073=No), then the flow moves to block B1075. In block B1075, the drop-pattern-generation device determines whether cell $c_{sy}$ is unassigned. If the drop-pattern-generation device determines that cell $c_{sy}$ is not unassigned (B1075=No), then the flow returns to block B1071. If the drop-pattern-generation device determines that cell $c_{sy}$ is unassigned (B1075=Yes), then the flow moves to block B1077, where the drop-pattern-generation device increases the drop count n by one, sets the flooding-sequence index z to one, and clears the neighbor list. The flow then returns to block B1040.

If in block B1073 the drop-pattern-generation device determines that all of the cells have been scanned (B1073=Yes), then the flow moves to block B1081. In block B1081, the drop-pattern-generation device sets a drop index i to one.

Next, in block B1083, the drop-pattern-generation device selects the location of drop di in the cells that are in fill set $l_i$, which define a drop region for drop $d_i$. FIG. 10 illustrates an example embodiment of an operational flow for assigning a drop position in a drop pattern. The operational flow for assigning a drop position in a drop pattern begins at block B102 where a predetermined fluid drop volume of a drop is received. This drop volume was already retrieved in block B1010 in the operational flow of FIG. 8. That is, the drop volume received in block B102 is the drop volume D described above with respect to block B1010. After receiving the drop volume, the operational flow of FIG. 10 may proceed to block B104 where information regarding an array of cells defining a desired fill set associated with the predetermined fluid drop volume is received. This information includes a predetermined fluid volume of each cell of the array of cells and a predetermined location of each cell of the array of cells. The information received in block B104 is the same information established in blocks B1020 to B1081 in the operational flow of FIG. 8. That is, the same steps described above with respect to blocks B1020 to B1081 provide an array of cells with particular locations, where each cell of the array of cells has an assigned fluid volume. An example of an array of cells with known locations and volumes is shown in FIG. 6. As discussed above, and shown in FIG. 6, each cell 165A, 165B of the array of cells 165 is located on the field material map 160. As also noted above, the color of each tile 161 in the field material map 160 indicates the volume of formable material at the location of the tile 161. Thus, each particular cell 165, being overlaid on tiles 161 in the field material map 160, has a different volume assigned to the cell as indicated by the different color shading within each cell 165.

Figure 11:
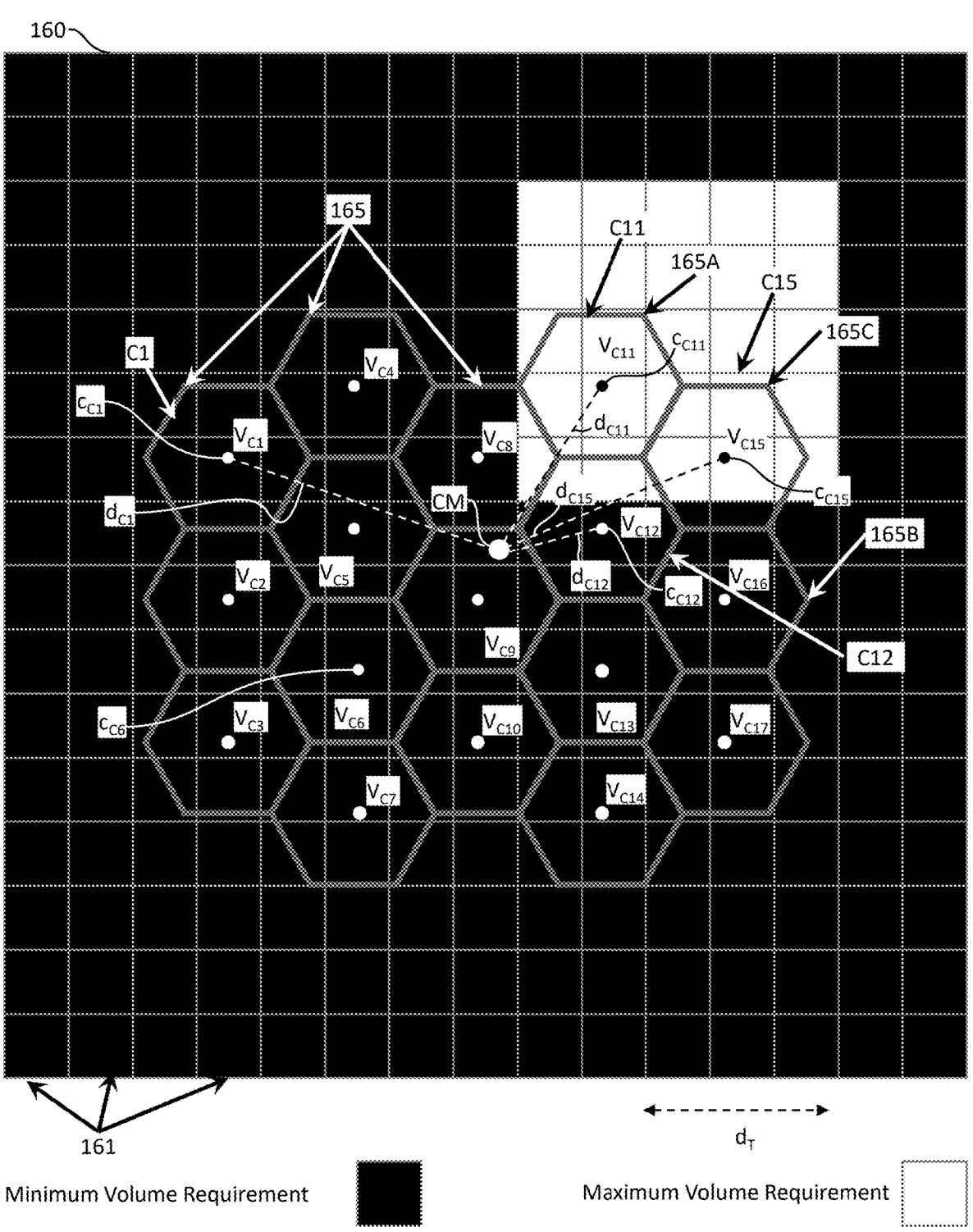
FIG. 11 illustrates an example embodiment of a set of cells overlaid on a field material map when implementing the operational flow of FIG. 10.

FIG. 11 illustrates the same set of cells overlaid on the field material map of FIG. 6, with additional information relevant to the operational flow of FIG. 10. In particular, as shown in FIG. 11, each cell of the array of cells has a particular volume notated by $V_{CX}$. "X" represents the particular cell number, i.e., "1" means cell 1, "2" means cell 2, etc., up to cell 17 in the illustrated example. While X is a positive integer from 1 to 17 in the illustrated example, X may be a positive integer from 1 to 200 or 1 to 1500, for example. C refers to "cell" and "V" refers to volume. Thus, "$V_{C1}$" refers the volume of the cell designated the first cell, $V_{C2}$ refers to the volume of the cell designated the second cell, etc., up to $V_{C17}$ which refers to the volume of cell designated the seventeenth cell in the illustrated embodiment. Individual cells within the fill set are identified by CX, thus C1 refers to the cell designated the first cell and C17 refers to the cell designated the $17^{th}$ cell.

FIG. 11 also shows the geometric center of each of the cells designated by the circle at the center of each cell. Four example centers are labeled $C_{C1}$, $C_{C11}$, $C_{C12}$, and $C_{C15}$. $C_{C1}$ is the center of the cell designated the first cell, $C_{C11}$ is the center of the cell designated the eleventh cell, $C_{C12}$ is the center of the cell designated as the twelfth cell, and $C_{C15}$ is the center of the cell designated as the fifteenth cell. While not illustrated, similar notation can be used to designate the center of each cell, i.e., $C_{CX}$, where X has the same definition as provided above. The geometric center, also known as the centroid, of each cell may be considered the predetermined location of each cell. That is, the predetermined location of each cell may be defined as the location of the geometric center of the cell on the field material map 160. In an alternative embodiment, a volume weighted center of the cell may be used as the geometric center to account for cells that include volume from different tiles.

FIG. 11 further shows the center of mass CM of the array of cells. The center of mass CM of the array of cells may be determined using standard methods. The mass density of the drops is constant, so that the volume may be used as a substitute for mass in the standard methods. For example, a summation technique may be used be used for calculating the center of mass by taking a volume weighted sum of the geometric centers of each cell and dividing by the total volume in array of cells. In addition, an integration technique may also be used for calculating the center of mass by integrating over the area of the field material map defined by the array of cells weighted by the position and divided the volume within the volume of the material map defined by the array of cells.

With the predetermined location of each cell is known (i.e., the location of the center of each cell in the field material map 160), and the center of mass of the array of cells 165 is known, the operational flow of FIG. 10 may proceed to block B106. In block B106, a distance from the center of mass of the array of cells to the predetermined location of each cell of a plurality of cells of the array of cells determined. The plurality of cells may be all the cells in the array of cells or may be a subset of the cells in the array of cells. Thus, in an embodiment the number of cells of the plurality of cells may be smaller than the number of cells of the array of cells, while in another embodiment the number of cells of the plurality of cells may be equal to than the number of cells of the array of cells. In the example shown below, to assist understanding, the array of cells only includes seventeen cells. However, in practice, the array of cells may be hundreds or thousands. For example, the number of cells in each array of cells may be 100 to 1500 cells. In some embodiments, when there are hundreds or over a thousand cells in the array of cells, the number of cells in the plurality of cells may be 10 to 200 cells for example. The plurality of cells may be the subset of cells that are closest to the center of mass. Thus, in an embodiment that has over a thousand cells in the array of cells, the 10 to 200 cells surrounding the center of mass may be the cells that are used in step B106 with the all the remaining cells being excluded from the determination.

FIG. 11 shows four example distances from the center of four different cells to the center of mass CM. The illustrated examples are $d_{C1}$, $d_{C11}$, $d_{C12}$, and $d_{C15}$. The distance $d_{C1}$ is the distance from the center of the cell designated the first cell (C1) to the center of mass CM (i.e., the distance between $C_{C1}$ and CM), $d_{C11}$ is the distance from the center of the cell designated as the eleventh cell (C11) and the center of mass CM (i.e., the distance between $C_{C11}$ and DM), $d_{C12}$ is the distance from the center of the cell designated as the twelfth cell (C12) and the center of mass CM (i.e., the distance between $C_{C12}$ and DM), and $d_{C15}$ is the distance from the center of the cell designated as the fifteenth cell (C15) and the center of mass CM (i.e., the distance between $C_{C15}$ and DM). While not illustrated, the distance from the center of each cell (or subset of cells) and the center of mass CM may be determined as part of performing block B106. Similar notation can be used to designate the distance from the center of each cell to the center of mass CM, i.e., $d_{CX}$, where X has the same definition as provided above.

With the distance from the center of mass of the array of cells to the predetermined location of each cell of the plurality of cells of the array of cells determined, the operational flow of FIG. 10 may proceed to block B108, where, among the cells of the plurality of cells of the array of cells whose distance from the center of mass is within a predetermined threshold distance, a cell that has the largest predetermined fluid volume is identified. In block B108, a subset of cells of the plurality of cells of the array of cells may be selected by comparing a) the distance between the center of each cell of the plurality of cells and the center of mass to b) the predetermined threshold distance. The predetermined threshold may be based on the on a distance between two adjacent locations dispensable by a dispenser. That is, as noted above, and described in the '921 patent, there is a set distance between adjacent dispensable locations for a dispenser. The predetermined threshold distance may be based on this set distance, more preferably be less than the set distance. For example, the predetermined threshold distance may be 50 microns to 150 microns, more preferably more than 25 microns and less than 35 microns (25 microns<predetermined threshold distance<35 microns). If the distance from a particular cell to the center of mass CM is greater than the predetermined threshold distance, then those cells are excluded from the subset. The threshold distance may be a multiple of a certain distance between adjacent nozzles of the fluid dispenser 122. The threshold distance may be a multiple of dispensable locations on the substrate. The dispensable locations may be a function of the certain distance between adjacent nozzles and the number scans of the dispenser over the substrate. Non-limiting examples of such a multiple are 0.3, 0.5, 1, 1.4, 2, 3.5, 4.2, and 7.

FIG. 11 shows an example predetermined threshold distance dr. The example predetermined threshold distance dr shown in FIG. 11 is selected for illustration only so that some of the cells in FIG. 11 fall outside the threshold. As noted above, in practice, there may be hundreds or over a thousand cells in the array of cells, in which case when the predetermined threshold is from 50 to 150 microns, many more cells would fall within the threshold. In the example of FIG. 11, because there are only seventeen cells, the example predetermined threshold distance dr is not sized as it would be in practice.

As an example, $d_{C1}$, $d_{C11}$, $d_{C12}$, and $d_{C15}$ (as well as the distance between the center of the cell and the center of mass for all the other cells) may be compared to dr. Each of the cells who distance from the center of mass CM is greater than the predetermined threshold distant $d_T$ are excluded from the subset of candidates and all those cells whose distance from the center of mass CM is equal to or smaller than the predetermined threshold distance is included in the subset of candidates. In the example illustration of FIG. 11, cells C1, C2, C3, C4, C7, C10, C11, C14, C15, C16, and C17 all have distances from the center of the cells to the center of mass CM that is greater than the predetermined threshold distance dr, while cells C5, C6, C8, C9, C12, and C13 all have distances that are less than or equal to the predetermined threshold distance dr. Thus, in the example of FIG. 11, cells C5, C6, C8, C9, C12, and C13 are included in the subset of possible candidates, while cells C1, C2, C3, C4, C7, C10, C11, C14, C15, C16, and C17 are excluded from the subset of possible candidates. As noted above, while there are only seventeen cells in the example of FIG. 11 to aid in understanding, the actual array could include hundreds or over a thousand cells. The process of creating a subset of candidates can be applied to the entire array of cells or to a smaller selection of cells surrounding the center of mass. In the case that a smaller selection is used (e.g., 20 to 50 cells), all the other cells would be excluded from the candidate subset without determining how far those cells are from the center of mass.

Next, as part of block B108, a cell having the largest predetermined fluid volume is selected from the subset of candidate cells. As shown in FIG. 11, each cell has a predetermined fluid volume as indicated by the black and white background of the cells. Thus, the fluid volume of each cell of the subset of candidate cell is known. Block B108 is completed by identifying the cell of the subset of candidate cells that has the largest predetermined fluid volume. In some cases, there may be multiple cells in the subset of candidate cells that has the same predetermined fluid volume. In that case, the identified cell may be randomly assigned from those cells having an identical predetermined fluid volume. In the example shown in FIG. 11, the cell with the largest volume among the cells located within the predetermined threshold distance is cell C12. That is, among cells C5, C6, C8, C9, C12, and C13 that are within the predetermined threshold dr, cell C12 has the highest volume in the example embodiment, where white represents high volume and black represents low volume. While the example embodiment shows only black and white for simplicity, the same principle can be applied to gradations of volume that could be represented by shades of gray.

After identifying the cell that is both within the predetermined threshold distance and has the greatest fluid volume, the operational flow may proceed to block B110. In block B110 the predetermined location of the identified cell is assigned as the drop position of the drop in the drop pattern. That is, whichever cell is selected following the completion of block B108, the location of that cell becomes the location of the drop to be dispensed as part of a drop pattern. More particularly, the center or centroid of the assigned cell will be the location of the drop to be dispensed. In the example of FIG. 11, the location of cell C12 will thus be the location of the drop to be dispensed, and more particularly, the geometric center of cell C12. The completion of block B110 is also the completion of block B1083 in FIG. 11 (as well as blocks B450 of FIGS. 4 and B765 of FIG. 7).

Returning to FIG. 8, next, after completing block B1083, the operation flow proceeds to block B1085, where the drop-pattern-generation device increases the drop index i by one. Then, in block B1087, the drop-pattern-generation device determines if the drop index i is greater than the drop count n. If the drop-pattern-generation device determines that the drop index i is not greater than the drop count n (B1087=No), then the flow returns to block B1083. Thus, each time that the flow returns to block B1083, the same process of FIG. 10 is performed for every drop that is to be placed in the overall drop pattern. In other words, the same operational flow described in FIG. 10 is performed for every drop di as part of performing block B1083 until the drop pattern is completed in block B1090. This process can be performed tens of thousands or millions of times to produce a single final drop pattern. That is, the final drop pattern may tens of thousands or millions of drop positions, each having been located in the pattern following the operational flow of FIG. 10. For example, the drop pattern may have 10,000 to six million drop positions. In an embodiment the drop volumes may be different (i.e., at least one drop has a different drop volume than at least one other drop). In another embodiment all the drops may have the same volume.

If the drop-pattern-generation device determines that the drop index i is greater than the drop count n (B1087=Yes), then the flow advances to block B1090. That is, the flow reaches block B1090 when every drop has been placed in the overall drop pattern. In block B1090, the drop-pattern-generation device outputs or stores the drop locations, which define a drop pattern. The flow then ends in block B1095. At the completion of FIG. 8 a full drop pattern has been generated.

FIGS. 12-15 illustrates another example embodiment showing how the volume of each individual cell is predetermined. As noted above, in the example embodiment of FIG. 11, the volume of each cell 165 comes from field material map 160 on which the cells 165 are overlaid. That is, as described above, the predetermined volume of each cell is based on the volume information in the field material map 160. However, in the example embodiment of FIGS.

12-15, the field material map 160 is blurred and the predetermined volume of each cell is based on the blurred field material map.

Figure 12:
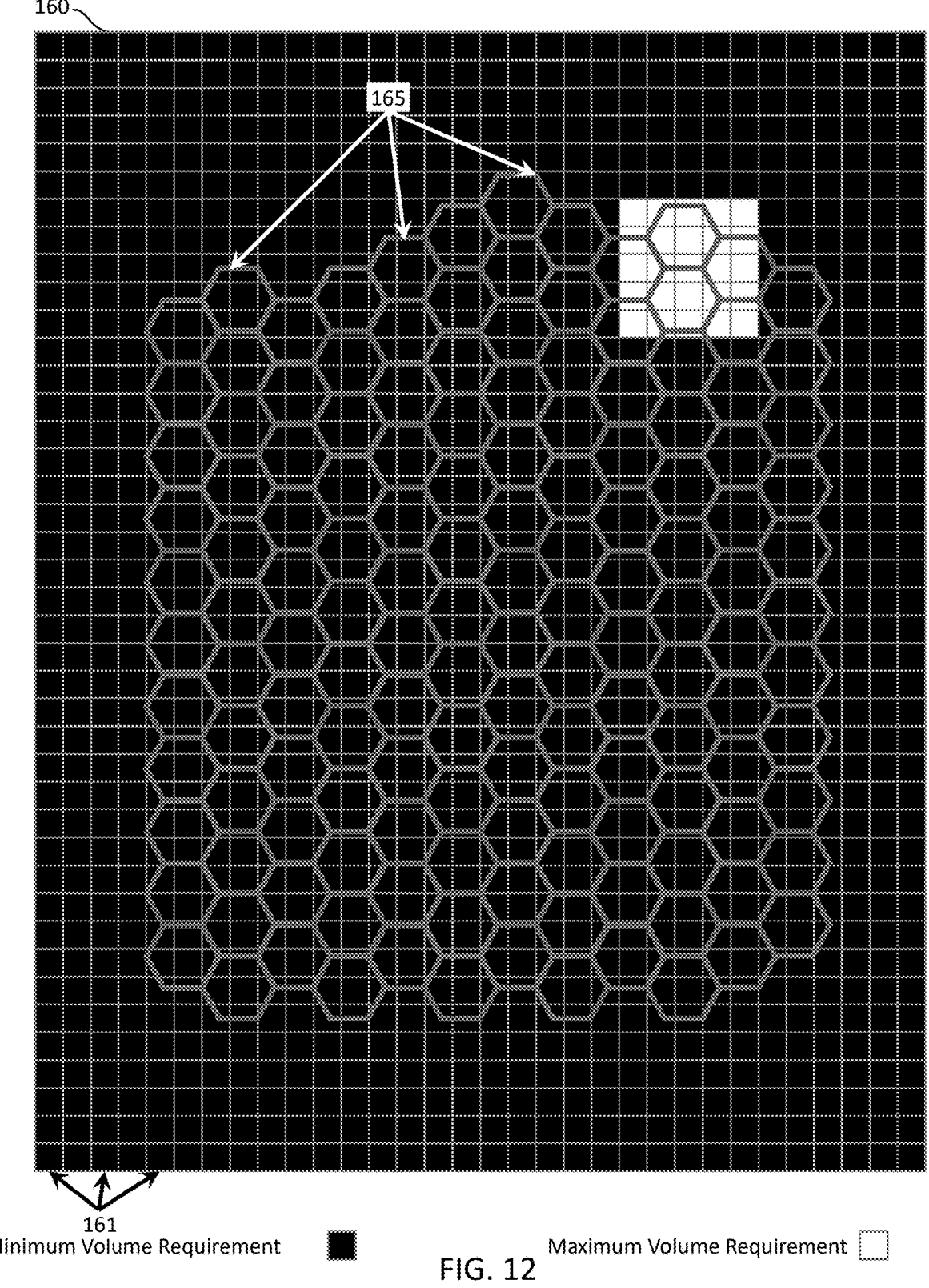
FIGS. 12-15 illustrates another example embodiment of a set of cells overlaid on a field material map when implementing the operational flow of FIG. 10, in which blurring is applied to the field material map.

FIG. 12 illustrates a larger set of cells 165 overlaid on the field material map 160 prior to any blurring having been performed. FIG. 12 is essentially the same as FIG. 6, but with more cells 165 overlaid on a larger field material map 160. A larger field material map and more cells aids in illustrating the blurring of the field material map.

Figure 13:
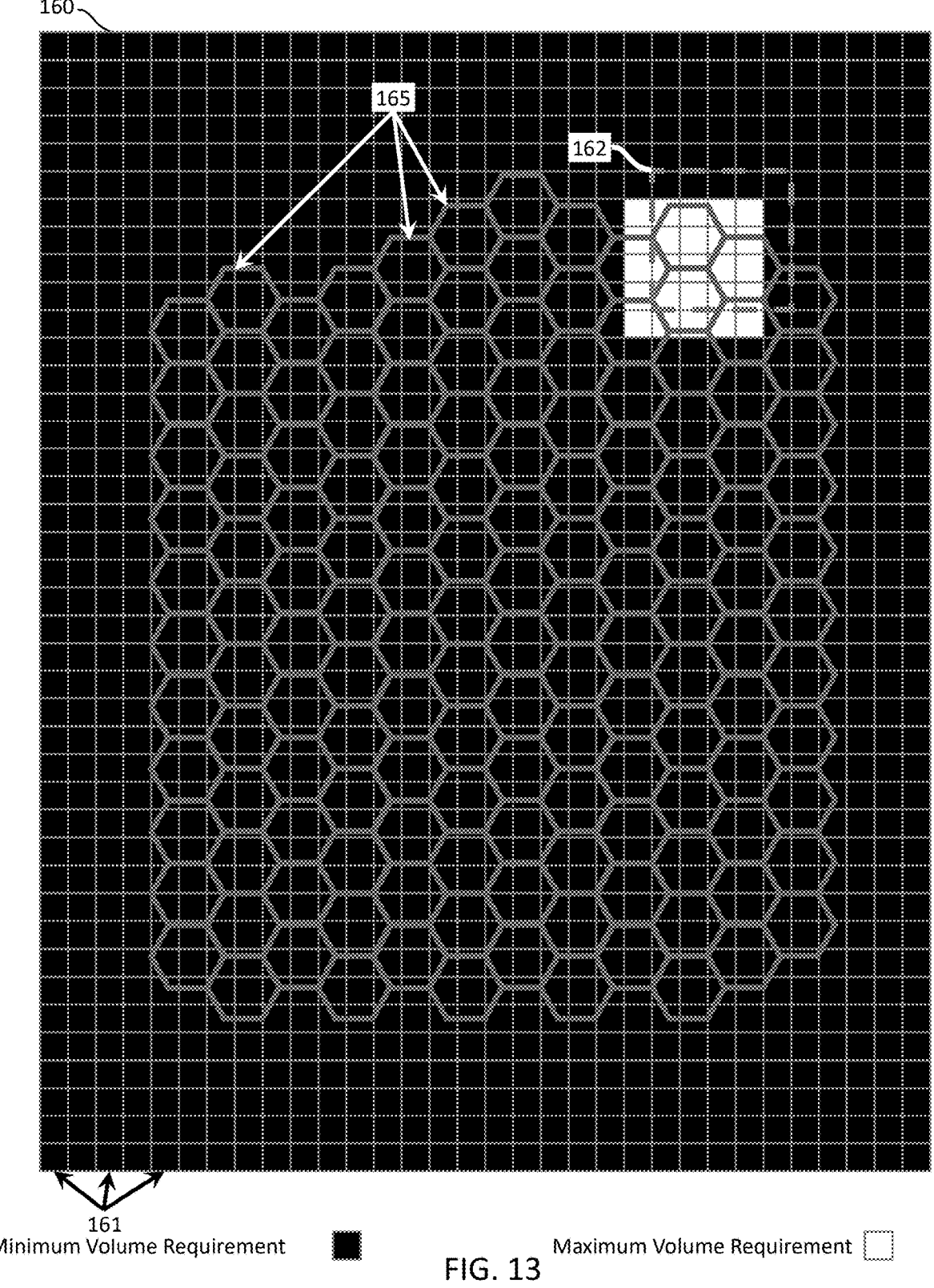

FIG. 13 illustrates the same cells 165 and field material map 160 of FIG. 12 during a first step in the blurring process. As shown in FIG. 13 a first set of the tiles 161 of the field material map 160 have been selected using a box filter 162. In the example embodiment the size of the box filter is 5×5 tiles. However, any odd number by odd number of tiles can be selected depending on the desired width A (or height B) of the filter. The desired width/height of the filter may be based on the predetermined drop volume of the drop. That is, the size of the box filter may be A×B, where A is an odd number and B is an odd number, wherein the selection of A and B is based on the predetermined drop volume. A may be 3 to 21 tiles. B may be 3 to 21 tiles. Once selected, the total volume of the tiles 161 within the box filter 162 is averaged. In general, A is typically equal to B but may be unequal depending on the size of the largest features within the volume requirement map in the directions of A and B. In general, A and B should be at least half the size of the largest feature in the directions of A and B.

Figure 14:
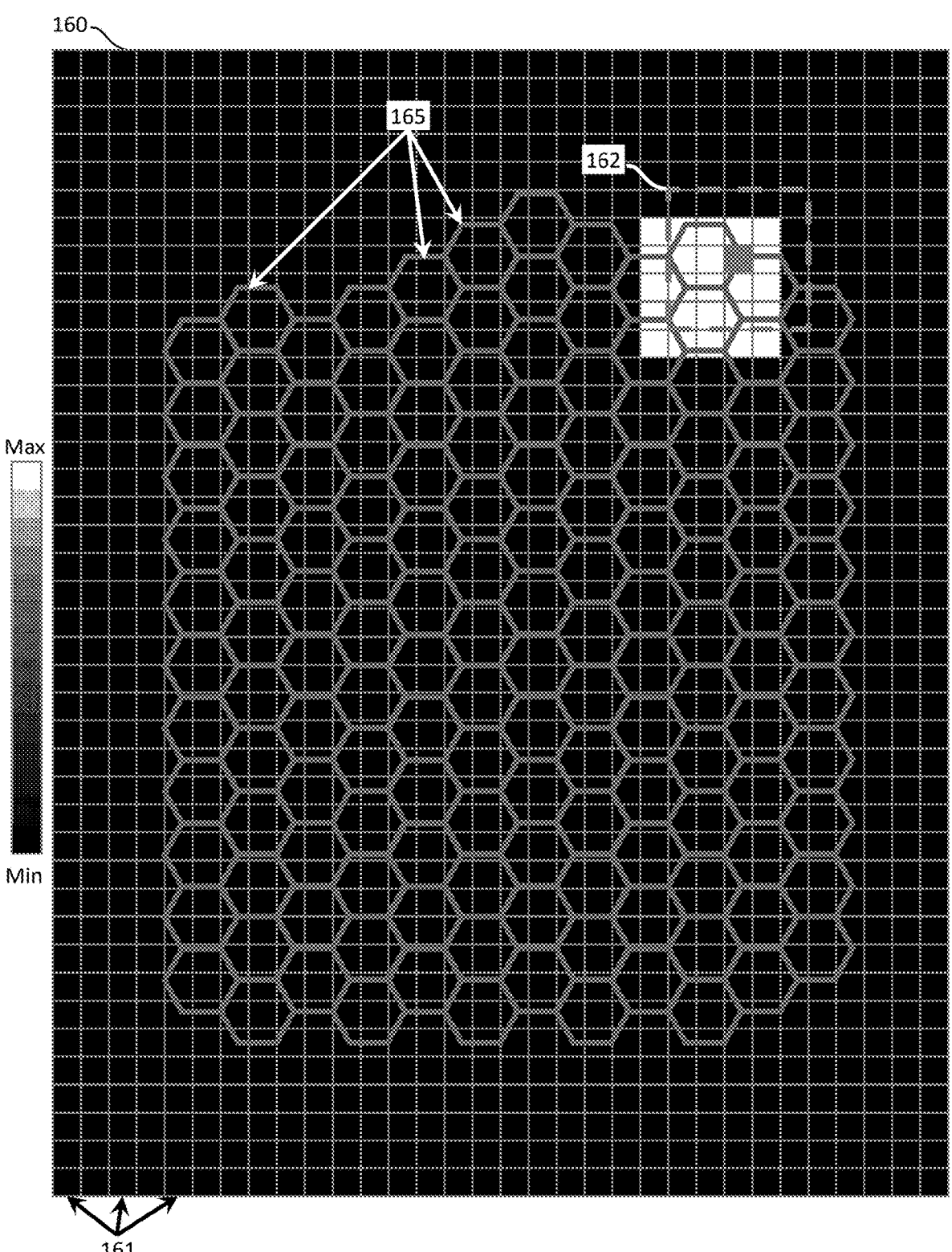

FIG. 14 illustrates the same cells 165 of FIG. 12 overlaid on a modified field material map after the first blurring step described above has been completed. As shown in FIG. 14, the average volume encompassed by the box filter 162 is assigned to the center tile 163 of the box filter 162. That is, the field material map in FIG. 14 has been altered such that one tile (tile 163) now has a new volume assigned to it that is the average volume of the surrounding 5×5 box filter. This blurring step is performed for the entirety of the field material map until every tile has an updated volume that is the average of the surrounding 5×5 box filter.

Figure 15:
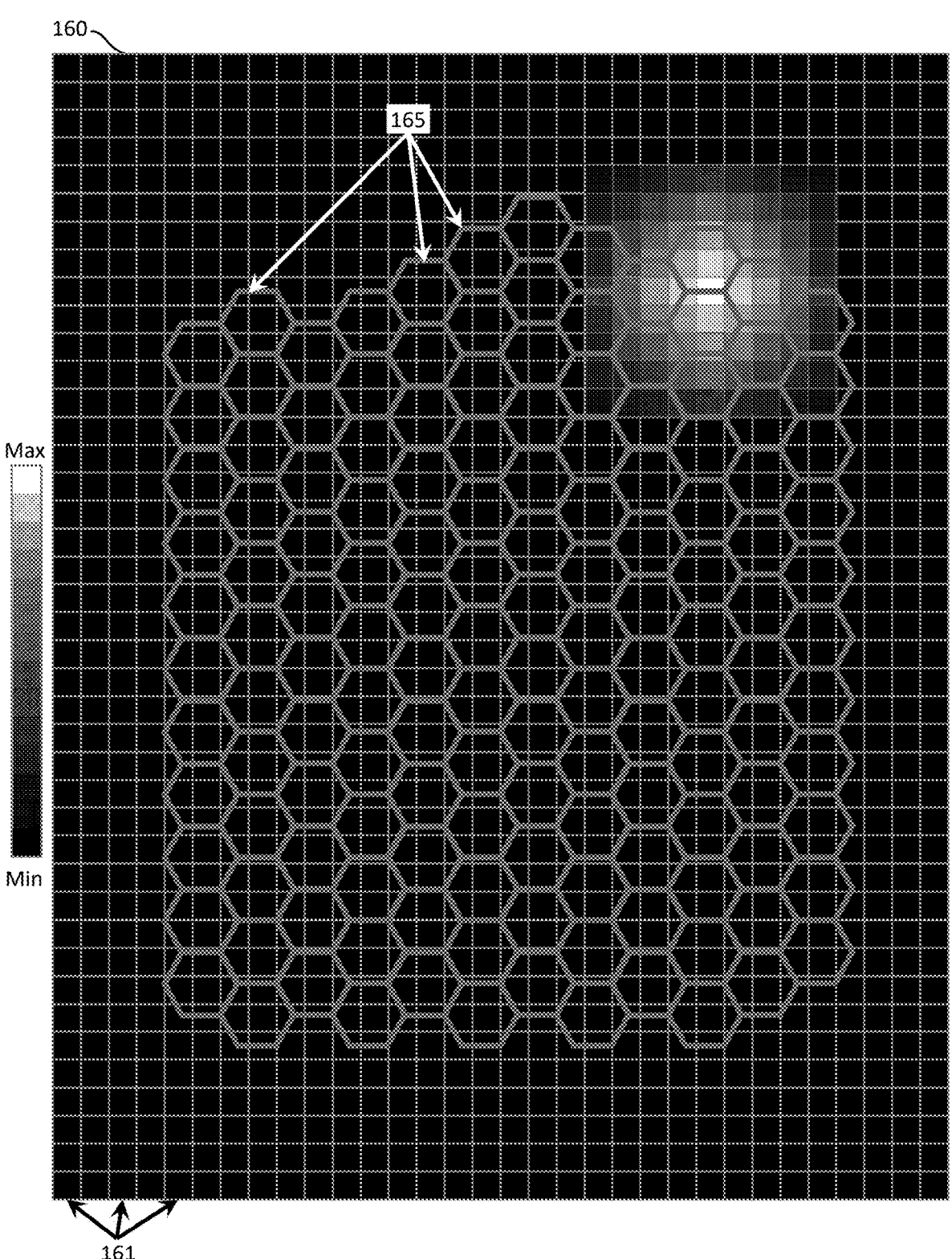

FIG. 15 shows the same cells 165 of FIG. 12 overlaid on a fully modified (blurred) field material map. As shown in FIG. 15, every tile of the field material map has a new volume assigned as compared to the pre-blurred field material map of FIG. 12. Once the blurred field material map of FIG. 15 is generated, the predetermined volume of each cell 165 is now based on the blurred field material map instead of the original field material map. That is, in the example embodiment where the field material map is blurred, the predetermined fluid volume of the cells used in the operation flow of FIG. 10 is based on the blurred field material map instead of a non-blurred field material map. In other words, the operational flow described above with respect to FIGS. 8 and 10 is the same in the case of blurring, except that the predetermined fluid volume of the cells is different.

As a result of following the operational flow of FIGS. 4, 7, and 8 (in which the operational flow of FIG. 10 is followed to select the drop position in the drop pattern), a drop pattern is generated. Dispensing drops according to this drop pattern places the drops closer (e.g., less than 20 microns) from relatively large features (e.g., features having a width of 50 microns or greater). Specifically, by following the operational flow of FIG. 10, the drop location is assigned to a cell that is both within a certain threshold distance from the center of mass of the array of cells and having the most volume. Thus, the position of the drop is assigned a location in the pattern that that is closer to large features than it would be without performing the operational flow of FIG. 10. By placing the drops in the drop pattern in in this manner, the relatively large features will fill faster thereby improving productivity (throughput) as compared to drops dispensed according to a drop pattern that does not follow the operational flow of FIG. 10.

Furthermore, by blurring the field material map, and using the blurred field material map to set the predetermined fluid volume of the cells in the operational flow of FIG. 10, the drop position moves closer to the center of the etched feature. In other words, by blurring the field material map, the drop placement using the above-described operational flow will move toward the middle of the feature rather than the edge. Having the drops located at the middle of the etched feature will improve filling with fewer non-fill defects.

Figure 16:
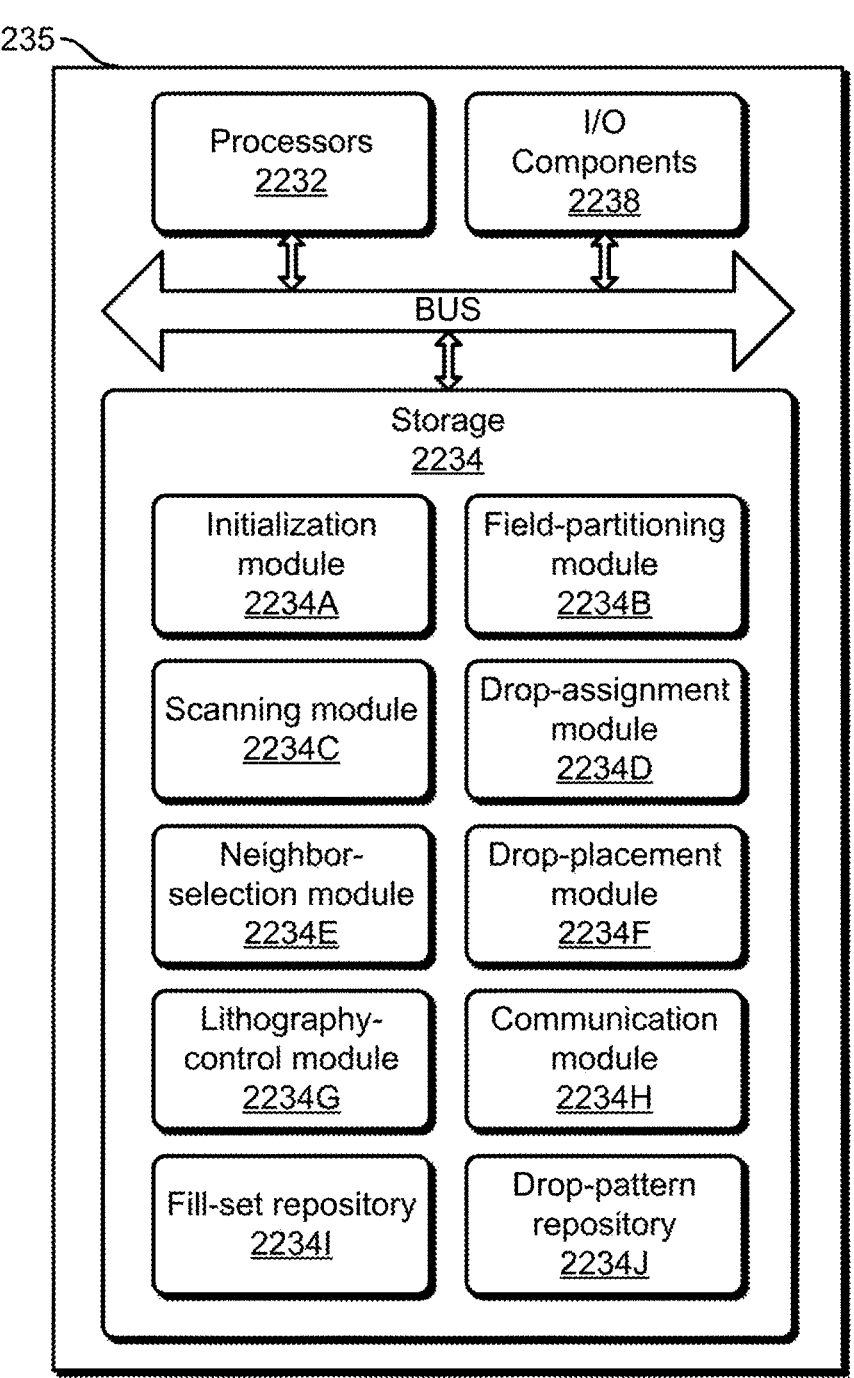
FIG. 16 illustrates an example embodiment of a nanoimprint-lithography-control device.

FIG. 16 illustrates an example embodiment of a drop-pattern-generation device. The drop-pattern-generation device 2235 includes one or more processors 2232, one or more I/O components 2238, and storage 2234. Also, the hardware components of the drop-pattern-generation device 2235 communicate via one or more buses or other electrical connections. Examples of buses include a universal serial bus (USB), an IEEE 1394 bus, a Peripheral Component Interconnect (PCI) bus, a Peripheral Component Interconnect Express (PCIe) bus, an Accelerated Graphics Port (AGP) bus, a Serial AT Attachment (SATA) bus, and a Small Computer System Interface (SCSI) bus.

The one or more processors 2232 include one or more central processing units (CPUs), which may include microprocessors (e.g., a single core microprocessor, a multi-core microprocessor); one or more graphics processing units (GPUs); one or more tensor processing units (TPUs); one or more application-specific integrated circuits (ASICs); one or more field-programmable-gate arrays (FPGAs); one or more digital signal processors (DSPs); or other electronic circuitry (e.g., other integrated circuits). The I/O components 2238 include communication components that communicate with one or more of the following: a substrate positioning stage, an imprint head, a fluid dispenser, an energy source, and a camera. Also, the I/O components 2238 may include communication components (e.g., a graphics card, a network-interface controller) that communicate with a network or with other input or output devices (not illustrated), which may include a display device, a keyboard, a mouse, a printing device, a touch screen, a light pen, an optical-storage device, a scanner, a microphone, a drive, and a controller (e.g., a joystick, a control pad).

The storage 2234 includes one or more computer-readable storage media. As used herein, a computer-readable storage medium includes an article of manufacture, for example a magnetic disk (e.g., a floppy disk, a hard disk), an optical disc (e.g., a CD, a DVD, a Blu-ray), a magneto-optical disk, magnetic tape, and semiconductor memory (e.g., a non-volatile memory card, flash memory, a solid-state drive, SRAM, DRAM, EPROM, EEPROM). The storage 2234, which may include both ROM and RAM, can store computer-readable data or computer-executable instructions.

The drop-pattern-generation device 2235 also includes an initialization module 2234A, a field-partitioning module 2234B, a scanning module 2234C, a drop-assignment module 2234D, a neighbor-selection module 2234E, a drop-placement module 2234F, a lithography-control module 2234G, and a communication module 2234H. A module includes logic, computer-readable data, or computer-executable instructions. In the embodiment shown in FIG. 22, the modules are implemented in software (e.g., Assembly, C, C++, C#, Java, BASIC, Perl, Visual Basic). However, in some embodiments, the modules are implemented in hardware (e.g., customized circuitry) or, alternatively, a combination of software and hardware. When the modules are implemented, at least in part, in software, then the software can be stored in the storage 2234. Also, some embodiments of the drop-pattern-generation device 2235 include additional modules, omit some of these modules, combine these modules into fewer modules, or divide these modules into more modules. Additionally, the drop-pattern-generation device 2235 includes a fill-set repository 2234I and a drop-pattern repository 2234J. The fill-set repository 2234I stores fill sets, and the drop-pattern repository 2234J stores drop patterns.

The initialization module 2234A includes instructions that cause the drop-pattern-generation device 2235 to obtain (e.g., set, receive) a drop volume, obtain a field material map, obtain a scanning sequence, obtain a flooding sequence, and initialize variables. For example, some embodiments of the initialization module 2234A include instructions that cause the drop-pattern-generation device 2235 to perform at least some of the operations that are described in blocks B405-B410 in FIG. 4, in blocks B705-B710 in FIG. 7, or in blocks B1005-B1015 in FIG. 8.

The field-partitioning module 2234B includes instructions that cause the drop-pattern-generation device 2235 to partition a field material map into cells and to determine a respective cell volume for each cell. For example, some embodiments of the field-partitioning module 2234B include instructions that cause the drop-pattern-generation device 2235 to perform at least some of the operations that are described in blocks B415-B420 in FIG. 4, in blocks B715-B720 in FIG. 7, or in blocks B1020-B1035 in FIG. 8.

The scanning module 2234C includes instructions that cause the drop-pattern-generation device 2235 to scan, according to a scanning sequence, a set of cells for an unassigned cell or to select a source cell. For example, some embodiments of the scanning module 2234C include instructions that cause the drop-pattern-generation device 2235 to perform at least some of the operations that are described in blocks B425 and B445 in FIG. 4, in blocks B725 and B750-B760 in FIG. 7, or in blocks B1040 and B1071-B1077 in FIG. 8.

The drop-assignment module 2234D includes instructions that cause the drop-pattern-generation device 2235 to assign drop volumes to cells, mark cells as assigned, add cells to fill sets, or calculate remaining drop volumes. For example, some embodiments of the drop-assignment module 2234D include instructions that cause the drop-pattern-generation device 2235 to perform at least some of the operations that are described in blocks B430-B440 in FIG. 4, in blocks B730 and B745 in FIG. 7, or in blocks B1045 and B1060 in FIG. 8. Also, the fill sets may be stored in the fill-set repository 2234I.

The neighbor-selection module 2234E includes instructions that cause the drop-pattern-generation device 2235 to add one or more neighboring cells to a neighbor list, which may be performed according to a flooding sequence. For example, some embodiments of the neighbor-selection module 2234E include instructions that cause the drop-pattern-generation device 2235 to perform at least some of the operations that are described in block B440 in FIG. 4, in blocks B735-B740 in FIG. 7, or in blocks B1047-B1055 and B1065-B1070 in FIG. 8.

The drop-placement module 2234F includes instructions that cause the drop-pattern-generation device 2235 to determine respective drop locations for drops based on the cells that are in the respective fill sets of the drops (the cells that have been assigned to the drops) and to generate drop patterns based on the drop locations. For example, some embodiments of the drop-placement module 2234F include instructions that cause the drop-pattern-generation device 2235 to perform at least some of the operations that are described in block B450 in FIG. 4, in block B765 in FIG. 7, or in blocks B1081-B1090 in FIG. 8.

The lithography-control module 2234G includes instructions that cause the drop-pattern-generation device 2235 to regulate, control, or direct other components or subsystems of a nanoimprint lithography system, such a substrate positioning stage, an imprint head, a fluid dispenser, an energy source, and a camera.

The communication module 2234H includes instructions that cause the drop-pattern-generation device 2235 to communicate with one or more other devices (e.g., a nanoimprint-lithography-control device) a substrate positioning stage, an imprint head, a fluid dispenser, an energy source, a camera, a monitor, another computing device).

At least some of the above-described devices, systems, and methods can be implemented, at least in part, by providing one or more computer-readable media that contain computer-executable instructions for realizing the above-described operations to one or more computing devices that are configured to read and execute the computer-executable instructions. The systems or devices perform the operations of the above-described embodiments when executing the computer-executable instructions. Also, an operating system on the one or more systems or devices may implement at least some of the operations of the above-described embodiments.

Furthermore, some embodiments use one or more functional units to implement the above-described devices, systems, and methods. The functional units may be implemented in only hardware (e.g., customized circuitry) or in a combination of software and hardware (e.g., a microprocessor that executes software).

The invention claimed is:

1. A method of imprinting or planarizing comprising:
generating a drop pattern including
   a) receiving a predetermined fluid drop volume of the drop;
   b) receiving information regarding an array of cells defining a desired fill set associated with the predetermined fluid drop volume, wherein the information includes a predetermined fluid volume of each cell of the array of cells and a predetermined location of each cell of the array of cells;
   c) determining a distance from a center of mass of the array of cells to the predetermined location of each cell of a plurality of cells of the array of cells;
   d) identifying, among cells of the plurality of cells whose distance from the center of mass is within a predetermined threshold distance, a cell having the largest predetermined fluid volume;
   e) assigning the predetermined location of the identified cell as the drop position of the drop in the drop pattern; and
   f) repeating a) to e) until completing the drop pattern;
dispensing drops of formable material onto a substrate according to the completed drop pattern,
wherein the substrate includes features having a width of 50 microns or greater, and
wherein dispensing the drops of formable material according to the completed drop pattern places the drops less than 20 microns from the features; and contacting the dispensed drops with a template or superstrate to form a film, wherein the contacting causes the dispensed drops to fill the features, and wherein a time to fill the features during the contacting is smaller than a time to fill the features in a case that the template or substrate contacts drops dispensed according to another drop pattern that does not place the drops less than 20 microns from the features.

2. The method of claim 1, wherein the predetermined fluid volume of each cell of the array of cells is based on a field material map.

3. The method of claim 2, wherein the field material map is blurred using a filter.

4. The method of claim 3, wherein the filter is a box filter.

5. The method of claim 4, wherein a width or height of the box filter is based on the predetermined fluid drop volume.

6. The method of claim 1, wherein the predetermined location of each cell coincides with a center or centroid of each cell.

7. The method of claim 1, wherein the array of cells includes 100 to 1500 cells.

8. The method of claim 1, wherein the plurality of cells has less cells than the array of cells.

9. The method of claim 1, wherein the plurality of cells and the array of cells has the same number of cells.

10. The method of claim 1, wherein the predetermined threshold distance is based on a distance between two adjacent locations dispensable by a dispenser.

11. The method of claim 1, wherein the predetermined threshold distance is 50 microns to 150 microns.

12. The method of claim 1, wherein the predetermined fluid drop volume is 0.3 picoliter to 3 picoliter.

13. The method of claim 1, wherein the predetermined fluid volume of each cell is 0.02 femtoliter to 300 femtoliter.

14. The method of claim 1, wherein the predetermined fluid volume of the identified cell is 0.01 picoliter to 0.3 picoliter.

15. The method claim 1, wherein a first instance of performing e) includes assigning a first drop at a first drop position in the drop pattern and a second instance of performing e) includes assigning a second drop to a second drop position in the drop pattern, and wherein a predetermined fluid drop volume of the first drop is different from a predetermined fluid drop volume of the second drop.

16. The method claim 1, wherein a first instance of performing e) includes assigning a first drop at a first drop position in the drop pattern and a second instance of performing e) includes assigning a second drop to a second drop position in the drop pattern, and wherein a predetermined fluid drop volume of the first drop is the same as a predetermined fluid drop volume of the second drop.

17. A method of manufacturing an article, comprising:

generating a drop pattern including a) receiving a predetermined fluid drop volume of the drop;

b) receiving information regarding an array of cells defining a desired fill set associated with the predetermined fluid drop volume, wherein the information includes a predetermined fluid volume of each cell of the array of cells and a predetermined location of each cell of the array of cells;

c) determining a distance from a center of mass of the array of cells to the predetermined location of each cell of a plurality of cells of the array of cells;

d) identifying, among cells of the plurality of cells whose distance from the center of mass is within a predetermined threshold distance, a cell having the largest predetermined fluid volume;

e) assigning the predetermined location of the identified cell as the drop position of the drop in the drop pattern; and f) repeating a) to e) until completing the drop pattern;

dispensing drops of formable material onto a substrate according to the completed drop pattern, wherein the substrate includes features having a width of 50 microns or greater, and wherein dispensing the drops of formable material according to the completed drop pattern places the drops less than 20 microns from the features;

contacting the dispensed drops with a template or superstrate to form a film, wherein the contacting causes the dispensed drops to fill the features, and wherein a time to fill the features during the contacting is smaller than a time to fill the features in a case that the template or substrate contacts drops dispensed according to another drop pattern that does not place the drops less than 20 microns from the features;

exposing the film under the template or the superstrate to actinic radiation;

processing the substrate; and forming the article from the processed substrate.

* * * * *